United States Patent

Yonemura et al.

(10) Patent No.: US 10,833,244 B2
(45) Date of Patent: Nov. 10, 2020

(54) PIEZOELECTRIC ELEMENT AND METHOD FOR MANUFACTURING SAME

(71) Applicant: SEIKO EPSON CORPORATION, Tokyo (JP)

(72) Inventors: Takayuki Yonemura, Suwa (JP); Yasuhiro Itayama, Chino (JP); Chikara Kojima, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 438 days.

(21) Appl. No.: 15/887,394

(22) Filed: Feb. 2, 2018

(65) Prior Publication Data

US 2018/0226560 A1 Aug. 9, 2018

(30) Foreign Application Priority Data

Feb. 8, 2017 (JP) ................. 2017-021630

(51) Int. Cl.
*H01L 41/047* (2006.01)
*B41J 2/045* (2006.01)
(Continued)

(52) U.S. Cl.
CPC ........ *H01L 41/047* (2013.01); *B41J 2/04581* (2013.01); *B41J 2/14233* (2013.01); (Continued)

(58) Field of Classification Search
CPC ............... H01L 41/047; H01L 41/0815; H01L 41/0973; H01L 41/317; B41J 2/04581; B41J 2/161; B41J 2/1623; B41J 2/1628; B41J 2/1629; B41J 2/1631; B41J 2/1632; B41J 2/1635; B41J 2/1642; B41J 2/1645; (Continued)

(56) References Cited

U.S. PATENT DOCUMENTS

2005/0253904 A1* 11/2005 Miyazawa ........... B41J 2/14233
347/68
2006/0232639 A1* 10/2006 Sumi ........................ B41J 2/161
347/68

(Continued)

FOREIGN PATENT DOCUMENTS

JP 2000-294844 10/2000
JP 2001-223404 A 8/2001
(Continued)

OTHER PUBLICATIONS

Kaoru Yamashita, et al., "Diaphragm deflection control of piezoelectric ultrasonic microsensors for sensitivity improvement", Sensor and Actuators A, vol. 139, 2007, pp. 118-123.

*Primary Examiner* — Thomas M Dougherty
(74) *Attorney, Agent, or Firm* — Workman Nydegger

(57) ABSTRACT

A piezoelectric element having a vibrating section including a vibrating plate, a first electrode, a piezoelectric layer, and a second electrode, in which a crystal orientation of a piezoelectric material forming the piezoelectric layer is (100) and a crystal structure of the piezoelectric material is a tetragonal crystal, and a total thickness $T_1$ of the vibrating plate and the first electrode and a total thickness $T_2$ of the piezoelectric layer and the second electrode have a relationship of $T_1 \geq T_2$.

5 Claims, 13 Drawing Sheets

(51) Int. Cl.
*B41J 2/16* (2006.01)
*B41J 2/14* (2006.01)
*H01L 41/317* (2013.01)
*H01L 41/08* (2006.01)
*H01L 41/09* (2006.01)
*B41J 2/04* (2006.01)
*B41J 2/15* (2006.01)

(52) U.S. Cl.
CPC .............. *B41J 2/161* (2013.01); *B41J 2/1623* (2013.01); *B41J 2/1628* (2013.01); *B41J 2/1629* (2013.01); *B41J 2/1631* (2013.01); *B41J 2/1632* (2013.01); *B41J 2/1635* (2013.01); *B41J 2/1642* (2013.01); *B41J 2/1645* (2013.01); *B41J 2/1646* (2013.01); *H01L 41/0815* (2013.01); *H01L 41/0973* (2013.01); *H01L 41/317* (2013.01); *B41J 2002/14241* (2013.01); *B41J 2002/14419* (2013.01)

(58) Field of Classification Search
CPC ............ B41J 2/1646; B41J 2002/14241; B41J 2002/14419; G41J 2/1628
USPC .................... 310/324, 358, 365; 501/134; 242/62.9 PZ, 62.9 R
See application file for complete search history.

(56) References Cited

U.S. PATENT DOCUMENTS

| | | | |
|---|---|---|---|
| 2007/0215715 A1* | 9/2007 | Fukui | B41J 2/14233 239/102.2 |
| 2008/0067898 A1* | 3/2008 | Aoki | H01L 41/0805 310/358 |
| 2008/0203856 A1* | 8/2008 | Miyazawa | H01L 41/1876 310/358 |
| 2008/0224571 A1* | 9/2008 | Miyazawa | B41J 2/1646 310/358 |
| 2009/0273652 A1* | 11/2009 | Kazama | H01L 41/0973 347/68 |
| 2009/0295876 A1 | 12/2009 | Kobayashi et al. | |
| 2013/0022736 A1 | 1/2013 | Kobayashi et al. | |
| 2013/0223191 A1 | 8/2013 | Nakamura et al. | |
| 2014/0111582 A1* | 4/2014 | Ohashi | B41J 2/1629 347/70 |
| 2015/0064804 A1 | 3/2015 | Horikiri et al. | |
| 2016/0240768 A1 | 8/2016 | Fujii et al. | |
| 2017/0040523 A1* | 2/2017 | Sakai | H01L 41/318 |

FOREIGN PATENT DOCUMENTS

| | | |
|---|---|---|
| JP | 2006-319945 A | 11/2006 |
| JP | 2009-289982 | 12/2009 |
| JP | 2013-175879 A | 9/2013 |
| JP | 2015-065398 A | 4/2015 |
| JP | 2015-088521 A | 5/2015 |
| JP | 2016-164939 A | 9/2016 |

* cited by examiner

PIEZOELECTRIC ELEMENT AND METHOD FOR MANUFACTURING SAME

This application claims priority under 35 U.S.C. § 119 to Japanese Patent Application No. 2017-021630 filed on Feb. 8, 2017, the entire disclosure of which is expressly incorporated by reference herein.

BACKGROUND

1. Technical Field

The present invention relates to a piezoelectric element and a method for manufacturing the same.

2. Related Art

In a deflection deformation-type piezoelectric element (deflection displacement-type piezoelectric element), a starting deflection position (initial deflection position) changes due to the internal stress of members forming a vibrating section. In the deflection displacement-type piezoelectric element, a vibrating plate, a first electrode, a piezoelectric layer, and a second electrode are sequentially laminated on a substrate on which a cavity (CAV) structure is formed, thereby forming a vibrating section.

For example, JP-A-2006-319945 reports that the starting deflection amount (initial deflection amount) affects the characteristics of a deflection displacement-type piezoelectric element. In JP-A-2006-319945, platinum is used as a lower electrode and gold is used as an upper electrode, and the initial deflection amount is adjusted by adjusting the thickness of platinum. In addition, JP-A-2013-175879 reports an ultrasonic element using iridium as the upper electrode, and JP-A-2015-88521 reports a piezoelectric element in which the piezoelectric film has a bimorph structure and the thicknesses of the first piezoelectric film and the second piezoelectric film are adjusted to adjust the initial deflection amount.

On the other hand, as shown in JP-A-2001-223404, in the related art, the piezoelectric layer forming the piezoelectric element uses lead zirconate titanate (PZT) having a phase boundary (MPB: Morphotropic Phase Boundary) composition represented by Zr/(Ti+Zr)=0.52. It is known that the crystal structure of PZT in this composition is a monoclinic or rhombohedral crystal.

However, since PZT having an MPB composition has been used as a material forming the piezoelectric layer, it is no longer possible to control the initial deflection position using the compressive stress of the piezoelectric layer. Here, such a problem is not limited only to the deflection displacement-type piezoelectric element, but is also present in all piezoelectric element application devices in which a piezoelectric element is mounted.

SUMMARY

An advantage of some aspects of the invention is to provide a piezoelectric element capable of increasing a displacement amount of a vibrating plate and increasing the displacement amount of the whole element by controlling an initial deflection position on an upper convex structure using a piezoelectric layer, and a method for manufacturing the same.

According to an aspect of the invention, there is provided a piezoelectric element including a vibrating section including a vibrating plate, a first electrode, a piezoelectric layer, and a second electrode, in which a crystal orientation of a piezoelectric material forming the piezoelectric layer is (100) and a crystal structure of the piezoelectric material is a tetragonal crystal, and a total thickness $T_1$ of the vibrating plate and the first electrode and a total thickness $T_2$ of the piezoelectric layer and the second electrode have a relationship of $T_1 \geq T_2$.

In this case, it is possible to increase a displacement amount of the vibrating plate and to achieve an increase in the displacement amount of the whole element by controlling an initial deflection position on an upper convex structure using the piezoelectric layer.

Here, in the piezoelectric element, it is preferable that 50% or more of the crystal structure of the piezoelectric material be a tetragonal crystal. According to this, it is possible to further control the initial deflection position on the upper convex structure using the piezoelectric layer.

According to another aspect of the invention, there is provided a method for manufacturing a piezoelectric element having a vibrating section including a vibrating plate, a first electrode, a piezoelectric layer, and a second electrode, in which the piezoelectric layer is formed by a liquid phase method such that a crystal orientation of a piezoelectric material forming the piezoelectric layer is (100) and a crystal structure of the piezoelectric material is a tetragonal crystal, and the vibrating section is formed such that a total thickness $T_1$ of the vibrating plate and the first electrode and a total thickness $T_2$ of the piezoelectric layer and the second electrode have a relationship of $T_1 \geq T_2$.

In this case, it is possible to increase a displacement amount of the vibrating plate by controlling an initial deflection position on an upper convex structure using the piezoelectric layer, and to provide a piezoelectric element which is capable of achieving an increase in the displacement amount of the whole element.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
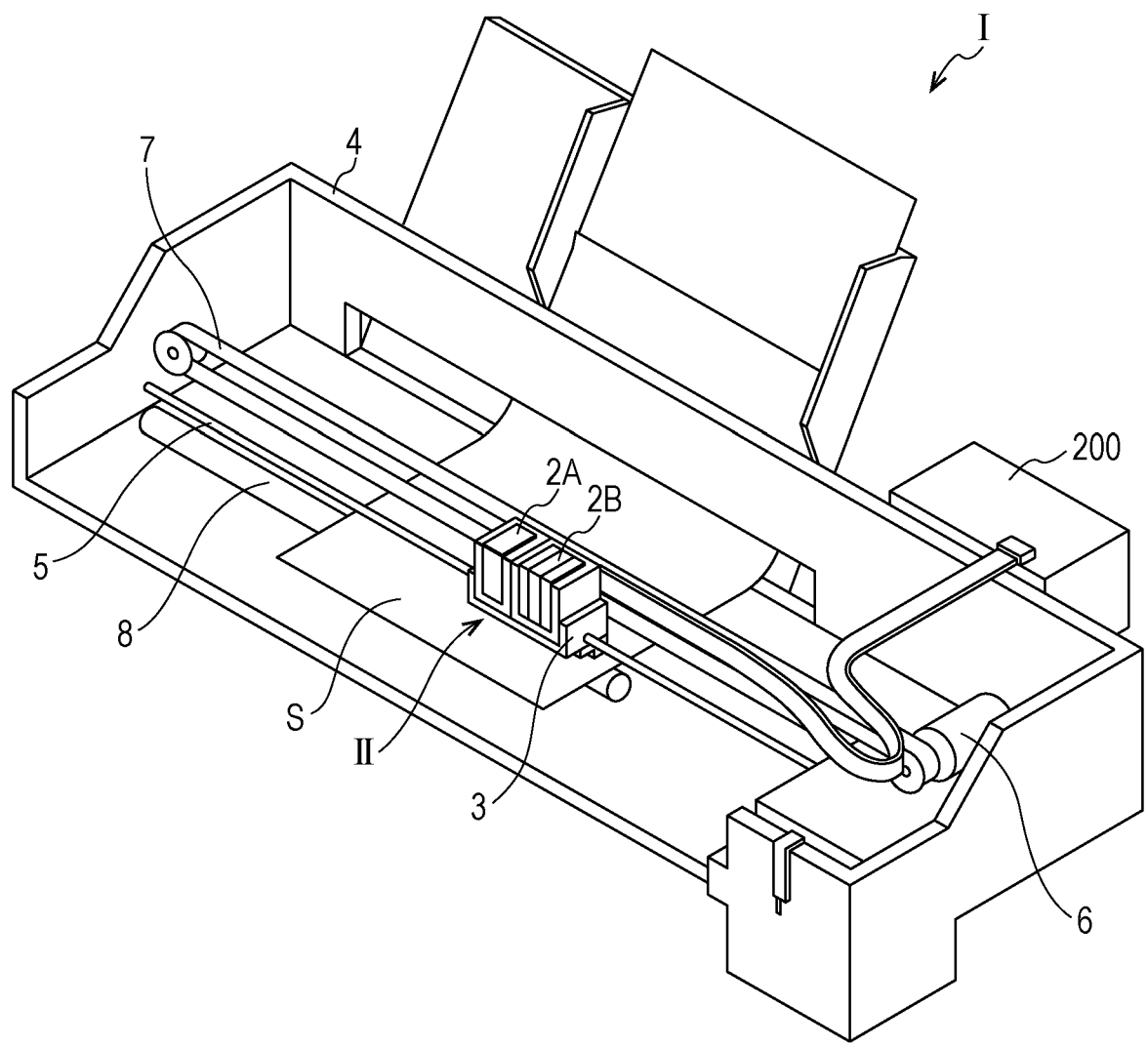
FIG. 1 is a perspective view showing a schematic configuration of an ink jet recording apparatus.

A description will be given below of embodiments of the invention with reference to the drawings. The following description shows one aspect of the invention, and is able to be freely changed within a range not deviating from the gist of the invention. Here, in each of the drawings, members to which the same reference numerals are attached denote the same members and explanation thereof is appropriately omitted. In addition, X, Y, and Z represent three spatial axes orthogonal to each other. In the present specification, a description will be given with directions along these axes taken as a first direction X (X direction), a second direction Y (Y direction), and a third direction Z (Z direction), respectively, and the direction in which the arrows are pointing in each diagram being the (+) direction, and the opposite direction to the arrow being the negative (−) direction. The X direction and the Y direction represent in-plane directions of the plate, layer, and film, and the Z direction represents the thickness direction or lamination direction of the plate, layer, and film.

In addition, the constituent elements shown in each drawing, that is, the shape and size of each section, the thicknesses of plates, layers, and films, the relative positional relationships, the repeating units, and the like may be exaggeratedly shown in order to illustrate the invention. Furthermore, the term "above" in this specification is not intended to limit the positional relationship of constituent elements to being "directly on". For example, the expression "the first electrode on the substrate" or "the piezoelectric layer on the first electrode" does not exclude the inclusion of other constituent elements between the substrate and the first electrode or between the first electrode and the piezoelectric layer.

First Embodiment

Liquid Ejecting Apparatus

First, a description will be given of an ink jet recording apparatus which is an example of a liquid ejecting apparatus with reference to the drawings.

FIG. 1 is a perspective view showing a schematic configuration of an ink jet recording apparatus. As shown in the diagram, in the ink jet recording apparatus (recording apparatus) I, an ink jet recording head unit (head unit) II is detachably provided in cartridges 2A and 2B. The cartridges 2A and 2B form an ink supply means. The head unit II has a plurality of ink jet recording heads (recording heads) 1 (refer to FIG. 2 and the like) which will be described below, and is mounted on a carriage 3. The carriage 3 is provided on a carriage shaft 5 attached to an apparatus main body 4 so as to be movable in the axial direction. The head unit II and the carriage 3 are formed to be capable of ejecting, for example, a black ink composition and a color ink composition, respectively.

The driving force of a driving motor 6 is transmitted to the carriage 3 via a plurality of gears (not shown) and a timing belt 7, and the carriage 3 on which the head unit II is mounted is moved along the carriage shaft 5. On the other hand, the apparatus main body 4 is provided with a transport roller 8 as a transport means, and a recording sheet S which is a recording medium such as paper is transported by the transport roller 8. The transport means for transporting the recording sheet S is not limited to the transport roller, but may be a belt, a drum, or the like.

In the recording head 1, a piezoelectric element 300 (refer to FIG. 2 and the like) which is a deflection deformation-type piezoelectric element (deflection displacement-type piezoelectric element) is used as the piezoelectric actuator device. Using the piezoelectric element 300 makes it possible to avoid deterioration of various characteristics (durability, ink ejection characteristics, and the like) in the recording apparatus I. Here, in the present embodiment, the deflection displacement-type piezoelectric element is used as an example, but other piezoelectric elements may be applied in a range not deviating from the gist of the invention.

Liquid Ejecting Head

Figure 2:
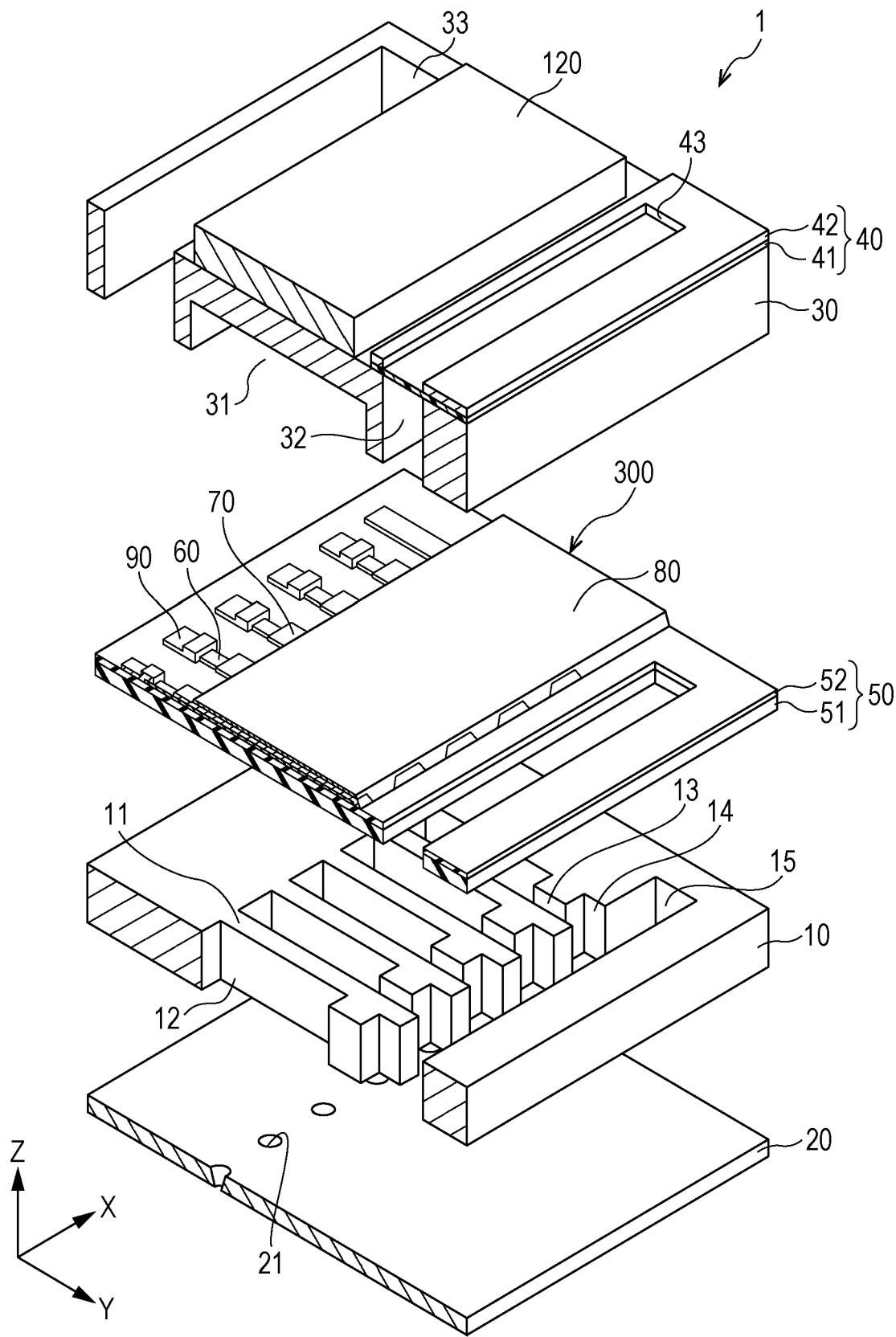
FIG. 2 is an exploded perspective view showing a schematic configuration of an ink jet recording head.
Figure 3:
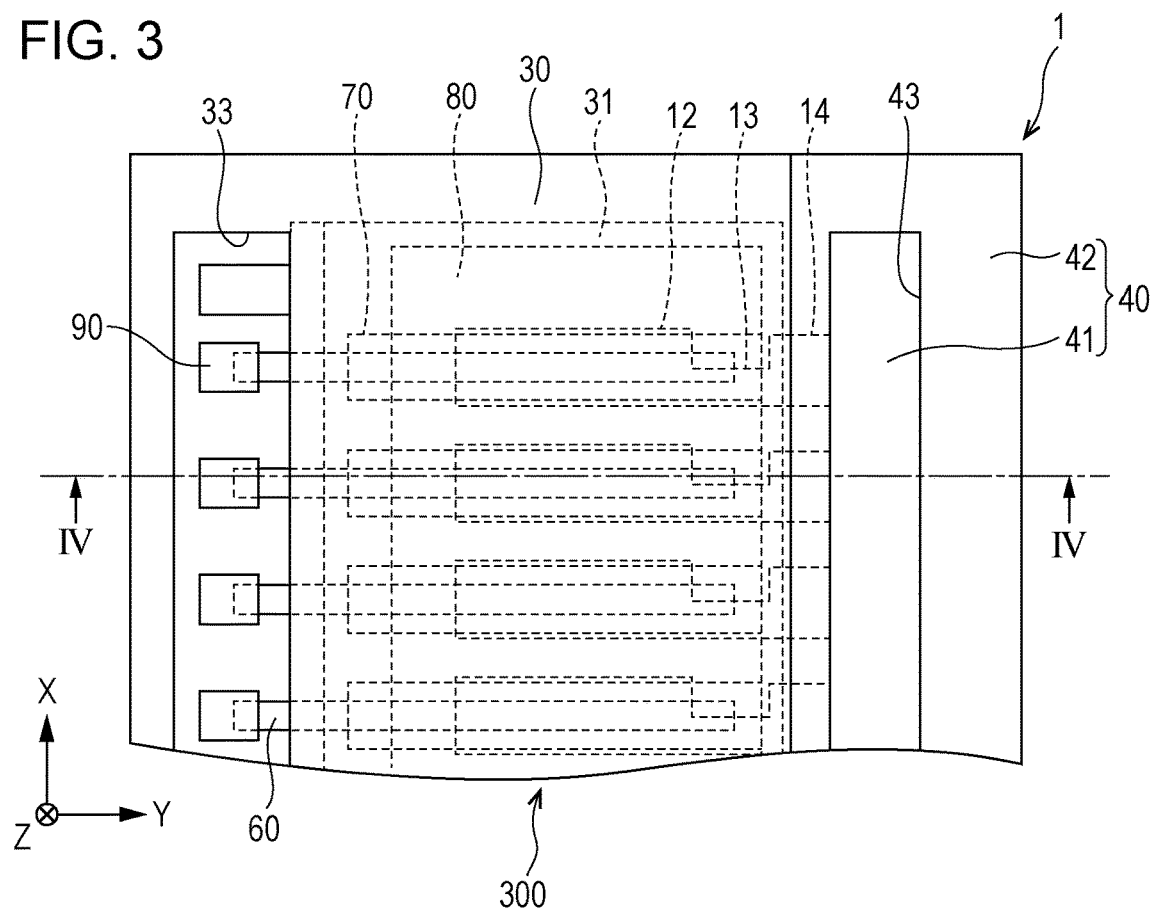
FIG. 3 is a plan view showing a schematic configuration of the ink jet recording head.
Figure 4:
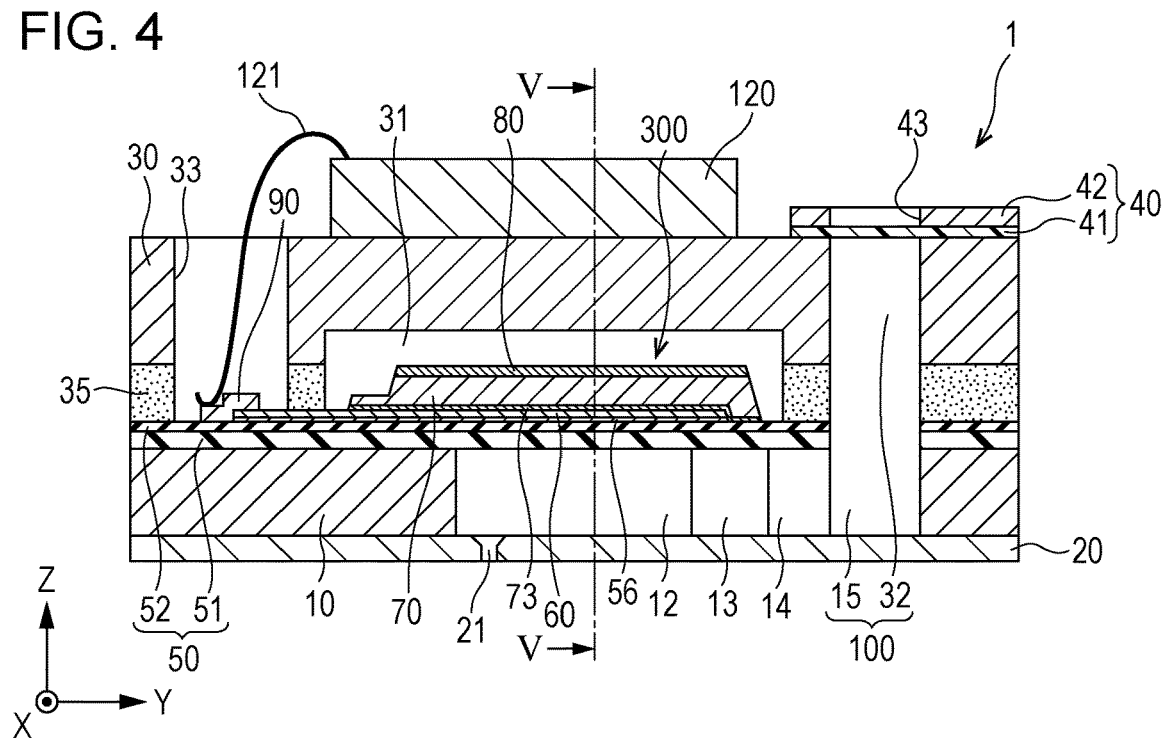
FIG. 4 is a cross-sectional view taken along a line IV-IV' of FIG. 3.

Next, a description will be given of the recording head 1 which is an example of the liquid ejecting head mounted on the liquid ejecting apparatus with reference to the drawings. FIG. 2 is an exploded perspective view showing a schematic configuration of the ink jet recording head. FIG. 3 is a plan view showing a schematic configuration of the ink jet recording head. FIG. 4 is a cross-sectional view taken along a line IV-IV' of FIG. 3. Here, FIG. 2 to FIG. 4 each appropriately omit sections showing parts of the configuration of the recording head 1.

As shown in the diagrams, a flow path forming substrate (substrate) 10 is formed of, for example, a silicon (Si) single crystal substrate. Here, the material of the substrate 10 is not limited to Si, and may be Silicon On Insulator (SOI), glass, or the like.

In the substrate 10, pressure generating chambers 12 partitioned by a plurality of partition walls 11 are formed. The pressure generating chambers 12 are lined up along a direction (+X direction) in which a plurality of nozzle openings 21 for ejecting ink of the same color are provided.

An ink supply path 13 and a communication passage 14 are formed on one end side (+Y direction side) of the pressure generating chamber 12 of the substrate 10. The ink supply path 13 is formed such that the area of the opening on the one end side of the pressure generating chamber 12 becomes small. In addition, the communication passage 14 has substantially the same width as the pressure generating chamber 12 in the +X direction. A communication portion 15 is formed on the outer side (the +Y direction side) of the communication passage 14. The communication portion 15 forms a part of a manifold 100. The manifold 100 is a common ink chamber for each pressure generating chamber 12. In this manner, a liquid flow path formed of the pressure generating chamber 12, the ink supply path 13, the communication passage 14, and the communication portion 15 is formed in the substrate 10.

A nozzle plate 20 made of SUS, for example, is bonded on one surface (the surface on the −Z direction side) of the substrate 10. In the nozzle plate 20, nozzle openings 21 are lined up in the +X direction. The nozzle opening 21 communicates with each pressure generating chamber 12. It is possible to bond the nozzle plate 20 to the substrate 10 using an adhesive, a heat welding film, or the like.

On the other surface (the surface on the +Z direction side) of the substrate 10, a vibrating plate 50 is formed. The vibrating plate 50 is formed of, for example, an elastic film 51 formed on the substrate 10 and an insulating film 52 formed on the elastic film 51. The elastic film 51 is formed of, for example, silicon dioxide ($SiO_2$), and the insulating film 52 is formed of, for example, zirconium oxide ($ZrO_2$). The elastic film 51 need not be a separate member from the substrate 10. A part of the substrate 10 may be thinned and used as the elastic film 51.

The piezoelectric element 300 including a first electrode 60, a seed layer 73, a piezoelectric layer 70, and a second electrode 80 is formed on the insulating film 52 via an adhesive layer 56. The adhesive layer 56 is formed of, for example, titanium oxide ($TiO_x$), titanium (Ti), silicon nitride (SiN), or the like, and has a function of improving the adhesion between the piezoelectric layer 70 and the vibrating plate 50. It is possible to omit the adhesive layer 56.

In the process of forming the piezoelectric layer 70 to be described below, in the case where an alkali metal such as potassium (K) or sodium (Na) is included in the piezoelectric material forming the piezoelectric layer 70, there may be diffusion into the first electrode 60. Therefore, providing the insulating film 52 between the first electrode 60 and the substrate 10 makes the insulating film 52 function as a stopper and makes it possible to prevent the alkali metal from reaching the substrate 10.

The first electrode 60 is provided for each pressure generating chamber 12. That is, the first electrode 60 is formed as an individual electrode independent for each pressure generating chamber 12. The first electrode 60 is formed with a width narrower than the width of the pressure generating chamber 12 in the ±X direction. In addition, the first electrode 60 is formed with a width wider in the ±Y direction than the pressure generating chamber 12. That is, in the ±Y direction, both ends of the first electrode 60 are formed to the outside of a region on the vibrating plate 50 opposed to the pressure generating chamber 12. A lead electrode 90 is connected to one end side (the side opposite to the communication passage 14) of the first electrode 60.

The seed layer 73 (also referred to as an orientation control layer) is provided between the first electrode 60 and the piezoelectric layer 70, for example, on the adhesive layer 56. The seed layer 73 has a function of controlling the crystal orientation of the piezoelectric material forming the piezoelectric layer 70. That is, providing the seed layer 73 makes it possible to preferentially orient the crystals of the piezoelectric material forming the piezoelectric layer 70 in a predetermined plane orientation. It is possible to omit the seed layer 73.

The piezoelectric layer 70 is provided between the first electrode 60 and the second electrode 80. The piezoelectric layer 70 is formed with a width wider than the width of the first electrode 60 in the ±X direction. In addition, the piezoelectric layer 70 is formed with a width wider than the length in the ±Y direction of the pressure generating chamber 12 in the ±Y direction. The end of the piezoelectric layer 70 on the side of the ink supply path 13 (+Y direction side) is formed to the outside of the end of the first electrode 60 on the +Y direction side. That is, the end of the first electrode 60 on the +Y direction side is covered with the piezoelectric layer 70. On the other hand, the end of the piezoelectric layer 70 on the lead electrode 90 side (−Y direction side) is more to the inner side (the +Y direction side) than the end of the first electrode 60 on the −Y direction side. That is, the end of the first electrode 60 on the −Y direction side is not covered with the piezoelectric layer 70. The piezoelectric layer 70 is a thin film piezoelectric material having a predetermined thickness described below.

The second electrode 80 is continuously provided on the piezoelectric layer 70 and the vibrating plate 50 in the +X direction. That is, the second electrode 80 is formed as a common electrode common to the plurality of piezoelectric layers 70. In the present embodiment, the first electrode 60 forms an individual electrode independently provided corresponding to the pressure generating chamber 12, and the second electrode 80 forms a common electrode provided continuously in the direction in which the pressure generating chambers 12 are lined up; however, the first electrode 60 may form a common electrode and the second electrode 80 may form an individual electrode.

In the present embodiment, the vibrating plate 50 and the first electrode 60 are displaced by the displacement of the piezoelectric layer 70 having electromechanical conversion characteristics. That is, the vibrating plate 50 and the first electrode 60 substantially function as a vibrating plate. However, in practice, since the second electrode 80 is also displaced by the displacement of the piezoelectric layer 70, the region in which the vibrating plate 50, the first electrode 60, the piezoelectric layer 70, and the second electrode 80 are sequentially laminated functions as a vibrating section of the piezoelectric element 300. Although the details will be described below, since the seed layer 73 is generally formed of a piezoelectric material, the seed layer 73 has electromechanical conversion characteristics. Therefore, in a case where the seed layer 73 is formed, the seed layer 73 and the piezoelectric layer 70 are displaced.

Here, the elastic film 51 and the insulating film 52 may be omitted so that only the first electrode 60 functions as a vibrating plate. In a case where the first electrode 60 is provided directly on the substrate 10, it is preferable to protect the first electrode 60 with an insulating protective film or the like such that the ink does not contact the first electrode 60.

A protective substrate 30 is bonded on the substrate 10 (vibrating plate 50) on which the piezoelectric element 300 is formed by an adhesive 35. The protective substrate 30 has a manifold portion 32. At least a part of the manifold 100 is formed by the manifold portion 32. The manifold portion 32 of the present embodiment penetrates the protective substrate 30 in the thickness direction (Z direction) and is formed across the width direction (+X direction) of the pressure generating chamber 12. The manifold portion 32 communicates with the communication portion 15 of the substrate 10. Through these configurations, the manifold 100 which is a common ink chamber of each pressure generating chamber 12 is formed.

On the protective substrate 30, a piezoelectric element holding portion 31 is formed in a region including the piezoelectric element 300. The piezoelectric element holding portion 31 has a space so as to not interfere with the movement of the piezoelectric element 300. This space may be sealed or not sealed. The protective substrate 30 is provided with a through hole 33 penetrating the protective substrate 30 in the thickness direction (Z direction). An end of the lead electrode 90 is exposed in the through hole 33.

Examples of the material of the protective substrate 30 include Si, SOI, glass, ceramics material, metal, resin, and the like, but it is more preferable that the material is formed of a material having substantially the same thermal expansion coefficient as the substrate 10. In the present embodiment, the protective substrate 30 is formed using Si, which is the same material as the substrate 10.

A driving circuit 120 functioning as a signal processing unit is fixed on the protective substrate 30. For the driving circuit 120, it is possible to use, for example, a circuit board or a semiconductor integrated circuit (IC: Integrated Circuit). The driving circuit 120 and the lead electrode 90 are electrically connected via a connection wiring 121 formed of a conductive wire such as a bonding wire inserted through the through hole 33. The driving circuit 120 is able to be electrically connected to a printer controller 200 (refer to FIG. 1). The driving circuit 120 functions as a control means for the piezoelectric actuator device (the piezoelectric element 300).

In addition, a compliance substrate 40 formed of a sealing film 41 and a fixing plate 42 is bonded on the protective substrate 30. The sealing film 41 is formed of a material having low rigidity, and it is possible to form the fixing plate 42 of a hard material such as metal. A region of the fixing plate 42 opposing the manifold 100 is an opening 43 completely removed in the thickness direction (Z direction). One surface (the surface on the +Z direction side) of the manifold 100 is sealed with only the flexible sealing film 41.

The recording head 1 ejects ink droplets in the following operation. First, ink is taken in from an ink introduction port connected to an external ink supply means (not shown), and the interior is filled with ink from the manifold 100 to the nozzle opening 21. Thereafter, according to the recording signal from the driving circuit 120, a voltage is applied between each of the first electrode 60 and the second electrode 80 corresponding to the pressure generating chamber 12, and the piezoelectric element 300 is deflected and deformed. Due to this, the pressure in each pressure generating chamber 12 is increased, and ink droplets are discharged from the nozzle opening 21.

Next, a description will be given of the configuration of the piezoelectric element 300 used as the piezoelectric actuator device of the recording head 1 with reference to the drawings.

Figure 5:
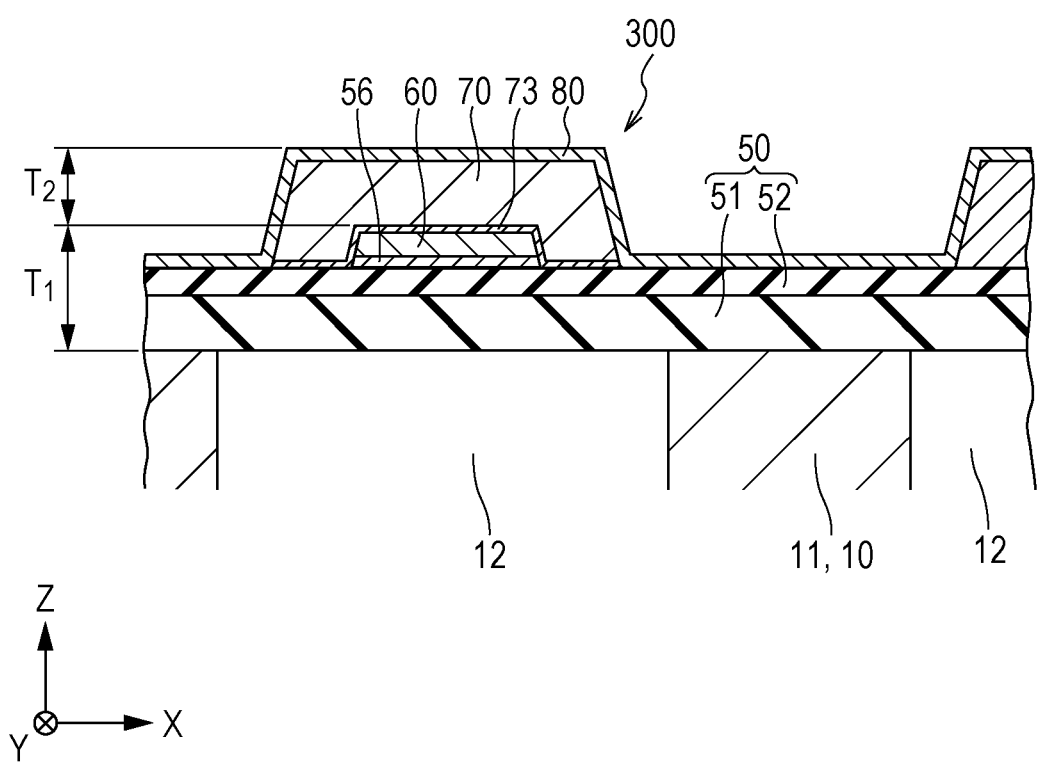
FIG. 5 is an enlarged cross-sectional view taken along a line V-V' of FIG. 4.

FIG. 5 is an enlarged cross-sectional view taken along a line V-V' of FIG. 4. As shown in the diagram, in the piezoelectric element 300, the vibrating plate 50 formed by the elastic film 51 and the insulating film 52 is formed on the substrate 10 on which the pressure generating chambers 12 partitioned by the plurality of partition walls 11 are formed, and the adhesive layer 56, the first electrode 60, the seed layer 73, the piezoelectric layer 70, and the second electrode 80 are sequentially laminated thereon, and the vibrating section is formed by the above.

In the vibrating plate 50, a region (vibrating section (also referred to as a movable part)) corresponding to the pressure generating chamber 12 is deflected (initial deflection) to be convex (that is, upwardly convex) to the opposite side of the pressure generating chamber 12 in a state where a voltage is not applied to piezoelectric element 300. The piezoelectric element 300 is formed so as to form the vibrating plate 50 having such an initial deflection. In this specification, being convex on the opposite side (the +Z direction side) from the pressure generating chamber 12 is expressed as "upwardly convex". In addition, being convex on the pressure generating chamber 12 side (−Z direction side) is expressed as "downwardly convex". The configuration in the vicinity of the piezoelectric element 300 differs according to the type of the recording head 1, but with the recording head 1 in which piezoelectric element 300 is provided on the side opposing the pressure generating chamber 12 of the vibrating plate 50, "upwardly convex" and "downwardly convex" are interpreted as described above for all types.

Figure 6:
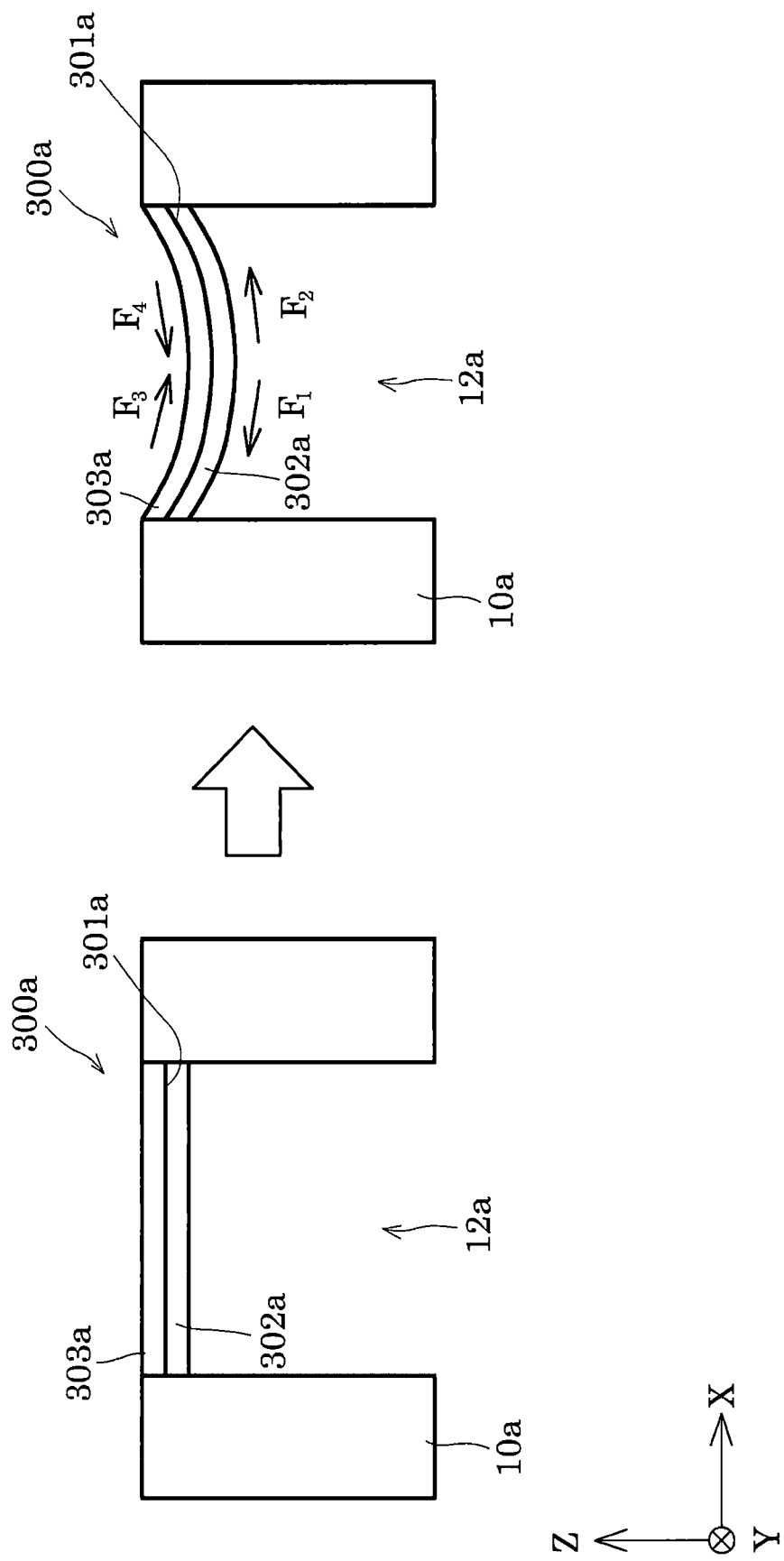
FIG. 6 is a view schematically showing an initial deflection position of a deflection displacement-type piezoelectric element.
Figure 7:
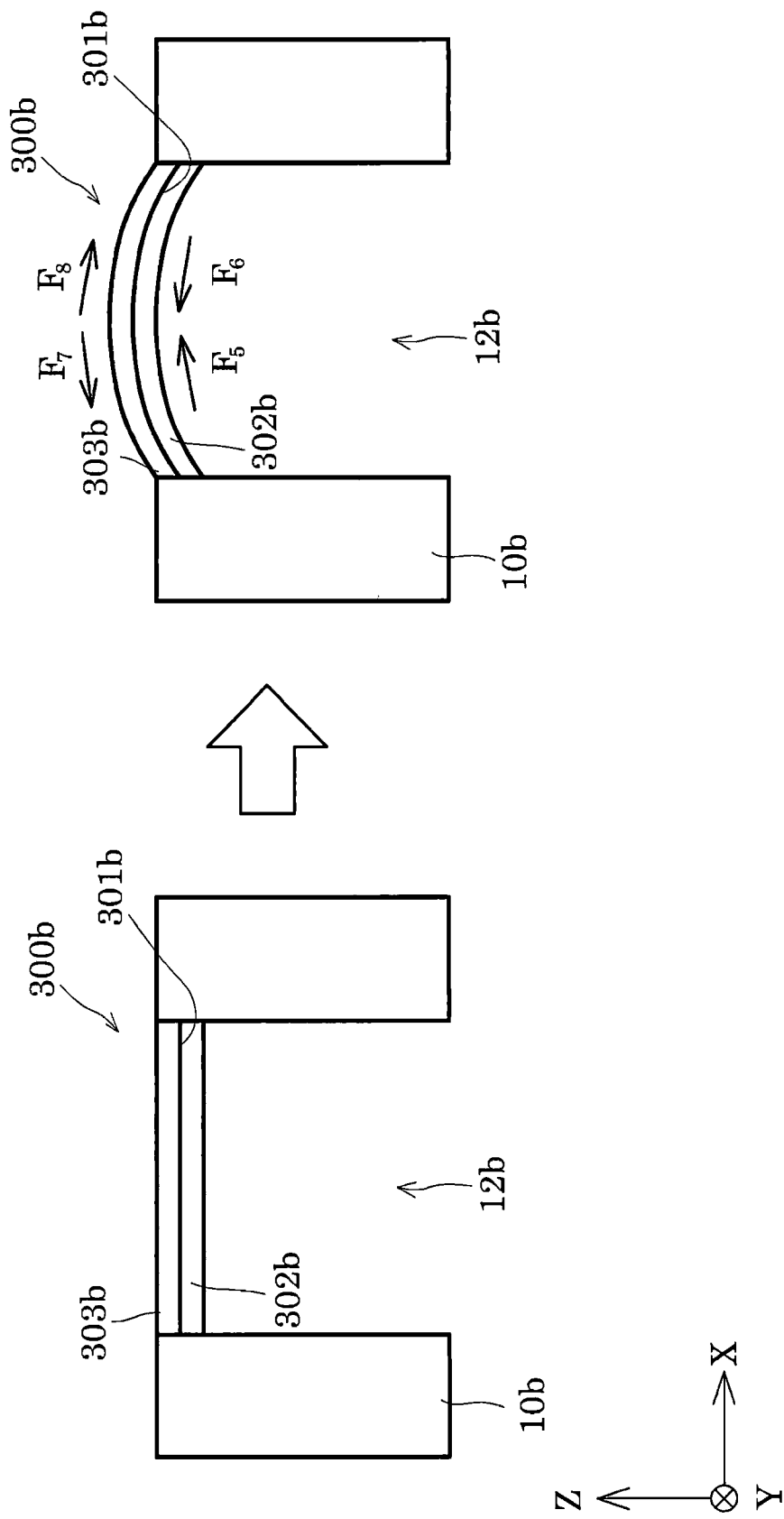
FIG. 7 is a view schematically showing the initial deflection position of the deflection displacement-type piezoelectric element.

FIG. 6 and FIG. 7 are views schematically showing initial deflection positions of the deflection displacement-type piezoelectric element. As shown in the diagrams, in the deflection displacement-type piezoelectric elements (referred to below as piezoelectric elements 300a and 300b), a vibrating plate, a first electrode, a piezoelectric layer, and a second electrode are sequentially laminated on substrates 10a and 10b formed with a cavity (CAV) structure (referred to below as spaces 12a and 12b), and the vibrating section is formed by the above. Here, for the piezoelectric elements 300a and 300b in the diagram, the structure of the piezoelectric element 300 in FIG. 5 is simplified.

In general, in the piezoelectric elements 300a and 300b, the initial deflection position changes due to the internal stress of the members (particularly, the vibrating plate and the piezoelectric layer) forming the vibrating section. In a case where a bending stress is generated in the vibrating section of the piezoelectric elements 300a and 300b, there are two patterns in how the stress is applied.

In the pattern shown in FIG. 6, there is internal stress (tensile stress) in the direction (the direction of arrows $F_1$ and $F_2$) in which a lower layer 302a of a neutral plane 301a of the piezoelectric element 300a extends and there is internal stress (compressive stress) in the direction (the direction of the arrows $F_3$ and $F_4$) in which an upper layer 303a of the neutral plane 301a contracts. Therefore, in the structure, the entire piezoelectric element 300a is deflected to the space 12a side. That is, the initial deflection position of the piezoelectric element 300a at this time is downwardly convex.

On the other hand, in the pattern shown in FIG. 7, there is internal stress (compressive stress) in the direction (the direction of arrows $F_5$ and $F_6$) in which a lower layer 302b of a neutral plane 301b contracts and there is internal stress (tensile stress) in the direction (the direction of the arrows $F_7$ and $F_8$) in which an upper layer 303b of the neutral plane 301b extends. Therefore, in the structure, the entire piezoelectric element 300b is deflected to the opposite side of the space 12b. That is, the initial deflection position of the piezoelectric element 300b at this time is upwardly convex.

The invention has an object of making the initial deflection position of the piezoelectric element 300 upwardly convex. In this case, the upper layer 303b side of the neutral plane 301b of the piezoelectric element 300 is subjected to tensile stress, and the lower layer 302b side of the neutral plane 301b is subjected to compressive stress. Therefore, in the invention, the internal stress of the piezoelectric layer 70 is tensile stress and the piezoelectric layer 70 is positioned on the upper layer 303b side of the neutral plane 301b in order to effectively apply the tensile stress to the initial deflection. That is, adjustment is carried out as follows.

Here, as shown in FIG. 5, in the vibrating section of the piezoelectric element 300, the total thickness $T_1$ from the vibrating plate 50 to the first electrode 60 and the total thickness $T_2$ from the piezoelectric layer 70 to the second electrode 80 have a relationship of $T_1 \geq T_2$. In a case where the seed layer 73 is formed, the total thickness from the seed layer 73 to the second electrode 80 is $T_2$.

In order to realize the pattern shown in FIG. 7, the vibrating section of the piezoelectric element 300 may be configured such that the relationship of the total thicknesses $T_1$ and $T_2$ satisfies $T_1 \geq T_2$. In a case where the relationship between the total thicknesses $T_1$ and $T_2$ satisfies $T_1 \geq T_2$, the piezoelectric layer 70 is positioned on an upper layer above the neutral plane, and it is possible to efficiently apply the tensile stress to the vibrating plate 50. That is, the piezoelectric layer 70 is arranged on the upper layer of the neutral plane, it is possible to efficiently apply the tensile stress of the piezoelectric layer 70 to the vibrating plate 50, and it is possible to set the initial deflection position of the piezoelectric element 300 is to be upwardly convex. Controlling the initial deflection position of the vibrating section of the piezoelectric element 300 to the upwardly convex structure makes it possible to increase the displacement amount of the vibrating plate 50.

On the other hand, when the vibrating section of the piezoelectric element 300 is formed such that the relationship of the total thicknesses $T_1$ and $T_2$ satisfies $T_1 < T_2$, the pattern shown in FIG. 6 is obtained, and a part of the piezoelectric layer 70 is arranged on the lower layer of the neutral plane, and compressive stress is applied from the lower layer even when the piezoelectric layer 70 is under tensile stress. Therefore, even when the piezoelectric layer 70 is subjected to tensile stress, it is not possible to effectively apply the stress to the vibrating plate 50, and the initial deflection position of the vibrating section of the piezoelectric element 300 becomes a downwardly convex structure and controlling initial deflection position to have an upwardly convex structure is difficult.

In the piezoelectric element 300, it is preferable that the thickness of the elastic film 51 be set to 0.1 μm or more and 2.0 μm or less, the thickness of the insulating film 52 be set to 0.01 μm or more and 1.0 μm or less, the thickness of the adhesive layer 56 be set to 0.005 μm or more and 0.1 μm or more, the thickness of the first electrode 60 be set to 0.01 μm or more and 1.0 μm or less, and the total thickness T1 from the vibrating plate 50 to the first electrode 60 be set to 0.12 μm or more and 4.0 μm or less. In addition, it is preferable that the thickness of the piezoelectric layer 70 be set to 0.1 μm or more and 3.0 μm or less, the thickness of the second electrode 80 be set to 0.01 μm or more and 1.0 μm or less, and the total thickness 12 from the piezoelectric layer 70 to the second electrode 80 be set to 0.11 μm or more and 4.0 μm or less. Here, in the case of forming the seed layer 73, the thickness thereof is set to 0.08 μm or less, preferably 0.01 μm or more and 0.05 μm or less. Here, the thicknesses of the respective elements listed here are just examples and it is possible to carry out changes within a range not changing the gist of the invention as long as it is possible to form the vibrating section of the piezoelectric element 300 such that the relationship of the total thicknesses $T_1$ and $T_2$ described above satisfies $T_1 \geq T_2$.

The material of the first electrode 60 and the second electrode 80 may be an electrode material which does not oxidize when forming the piezoelectric element 300 and which is able to maintain conductivity. Examples of such materials include metal materials such as platinum (Pt), iridium (Ir), gold (Au), aluminum (Al), copper (Cu), Ti, silver (Ag), or stainless steel; tin oxide-based conductive materials such as iridium oxide (IrOX), indium tin oxide (ITO), and fluorine-doped tin oxide (FTO), zinc oxide based conductive materials such as gallium doped zinc oxide (GZO), oxide conductive materials such as strontium ruthenate ($SrRuO_3$), nickel acid lanthanum ($LaNiO_3$), and elemental doped strontium titanate; conductive polymers and the like. Among these, noble metals such as Pt and Ir are suitable. As the electrode material, any one of the above materials may be used alone, or a laminate in which a plurality of materials are laminated may be used. The electrode material of the first electrode 60 and the electrode material of the second electrode 80 may be the same or different. In the present embodiment, Pt is used as the electrode material of the first electrode 60 and Pt and Ir are laminated for use as the electrode material of the second electrode 80.

It is sufficient if the piezoelectric layer 70 has an electromechanical conversion capability, and it is possible to appropriately select a piezoelectric material as necessary. As the piezoelectric layer 70, it is possible to use a composite oxide having a perovskite structure (perovskite-type composite oxide). The perovskite-type composite oxide is represented by, for example, General Formula $ABO_3$. In this case, the oxygen (O) atom of the A site is coordinated to 12, and the O atom of the B site is coordinated to 6 to form an eight-sided shape (octahedron). In addition, as long as the composite oxide is able to have a perovskite structure, unavoidable deviations in the stoichiometric composition due to lattice mismatches, oxygen deficiency or excess, or the like are permitted and the partial substitution of elements or the like is also permitted, and both are included in the perovskite-type composite oxide of the present embodiment.

As a typical perovskite-type composite oxide, it is possible to use lead zirconate titanate (PZT) based composite oxide including lead (Pb), Zr (zirconium), and Ti, for example. Accordingly, it is easy to secure the displacement amount of the piezoelectric element 300. In addition, it is also possible to apply multicomponent composite oxides or the like based on lead magnesium niobate-lead titanate (PMN-PT) or based on lead magnesium niobate-lead zirconate titanate (PMN-PZT) including Pb, magnesium (Mg), niobium (Nb), and Ti.

In addition, a lead-free piezoelectric material not including lead may be used for the piezoelectric layer 70. For example, it is also possible to use for example, perovskite-type composite oxides such as a bismuth ferrate (BFO)-based composite oxide including bismuth (Bi) and iron (Fe), a bismuth ferrate-barium titanate (BF-BT)-based composite oxide including Bi, barium (Ba), Fe, and Ti, a bismuth ferrate manganate-barium titanate (BFM-BT)-based composite oxide including Bi, Fe, manganese (Mn), Ba, and Ti, potassium sodium niobate (KNN) composite oxide including K, Na and Nb, and bismuth ferrate tantalate (BFT) including Bi, Fe, and tantalum (Ta). Accordingly, it is possible to realize the piezoelectric element 300 using a lead-free material having less environmental load.

Here, the piezoelectric layer 70 is not limited to the above example and may be formed by including other elements, for example, it is preferable to further include Mn. Accordingly, leakage current is easily suppressed, and for example, it is possible to realize a highly reliable piezoelectric element 300 as a lead-free material. In addition, the piezoelectric layer 70 may be formed to include elements such as lithium (Li), Ba, calcium (Ca), strontium (Sr), Zr, Ti, Bi, Ta, antimony (Sb), Fe, cobalt (Co), Ag, Mg, zinc (Zn), and Cu. Also in the case of the piezoelectric layer 70 including another such element, the piezoelectric layer 70 is preferably formed such that the composite oxide has a perovskite structure.

One or more of these elements may be included. Generally, the added amount of the elements is 20% or less, 15% or less, or 10% or less based on the total amount of the element which is the main component. Using the elements improves various characteristics and makes it possible to diversify the configuration and functions. Also, even in a case of a composite oxide containing these other elements, the piezoelectric layer 70 is preferably formed so as to have a perovskite structure.

In the piezoelectric material, for example, a representative composition of the PMN-PT type composite oxide is expressed as a mixed crystal of magnesium niobic acid and lead titanate. In such a mixed crystal, it is not possible to individually detect magnesium niobic acid or lead titanate by an X-ray diffraction pattern. However, unless otherwise specified, the PMN-PT based composite oxide also includes compositions deviating from the composition of the mixed crystal.

In addition, in the piezoelectric material, for example, the PMN-PT based composite oxide is not limited to only the perovskite-type composite oxide including Pb, Mg, Nb, and Ti. That is, the PMN-PT based composite oxide includes a piezoelectric material expressed as a mixed crystal including a perovskite-type composite oxide containing Pb, Mg, Nb and Ti and another perovskite-type composite oxide.

The material of the seed layer 73 is not particularly limited as long as the seed layer 73 functions as an orientation control layer of the piezoelectric layer 70, and it is possible to appropriately select the material as necessary. For example, from the viewpoint of maintaining the crystallinity and piezoelectric characteristics of the piezoelectric layer 70, it is preferable to use a piezoelectric material. A piezoelectric material similar to that of the piezoelectric layer 70 may be used or a different material may be used. In the present embodiment, PMN-PT or PZT is used as the piezoelectric layer 70 and BFT is used as the seed layer 73, but since the piezoelectric layer 70 and the seed layer 73 have an electromechanical conversion capability, these function as a piezoelectric layer of the piezoelectric element 300 in practice. Here, the material of the seed layer 73 does not necessarily have an electromechanical conversion capability.

The piezoelectric layer 70 and the seed layer 73 are formed using a piezoelectric material formed of a perovskite-type composite oxide represented by General Formula $ABO_3$. In a case where the piezoelectric layer 70 and the seed layer 73 are formed by a liquid phase method such as a metal-organic decomposition (MOD) method or a sol-gel method using such a piezoelectric material, generally, since a compressive stress is generated for reasons such as volumetric contraction due to desorption of an organic substance, the structure tends to be downwardly convex. For this reason, generally, an upwardly convex structure is formed by introducing a stress control layer. At this time, the upper electrode (second electrode) may also serve as a stress control layer. On the other hand, in the present embodiment, it is possible to perform stress control of the piezoelectric layer 70 and the seed layer 73 (in this case, tensile stress) by controlling the orientation of the crystal of the piezoelectric material in the (100) direction and controlling the crystal structure to be a tetragonal crystal. Due to this, it is possible to control the initial deflection position of the vibrating section of the piezoelectric element 300 to be an upwardly convex structure.

In the present embodiment, the piezoelectric layer 70 formed of the perovskite-type composite oxide is provided with the seed layer 73 for controlling the orientation of the piezoelectric layer 70, and, by applying the liquid phase method, the orientation of the crystal is preferentially oriented in the (100) direction and the crystal structure is a tetragonal crystal. Depending on the piezoelectric material of the seed layer provided as necessary, the manufacturing method thereof, or the like, the piezoelectric layer 70 may be preferentially oriented in the (110) plane or the (111) plane or may take a crystal structure other than a tetragonal crystal. Compared to a piezoelectric layer in which the crystal orientation is preferentially oriented in a random orientation or in another crystal plane, or which has a crystal structure other than tetragonal, it is easy to improve various characteristics for the piezoelectric layer 70 preferentially oriented in the (100) plane and having a tetragonal crystal structure.

In the present specification, preferentially oriented means that 50% or more of the crystals, and preferably 80% or more are oriented in a predetermined crystal plane. For example, "preferentially oriented in the (100) plane" includes a case where all the crystals of the piezoelectric layer 70 are oriented in the (100) plane and a case in which half or more of the crystals (60% or more, preferably 75% or more, and more preferably 80% or more) are oriented in the (100) plane.

In addition, in the present specification, the crystal structure of the piezoelectric material forming the piezoelectric layer 70 being a tetragonal crystal structure means that 50% or more, preferably 70% or more, of the crystal structure is tetragonal; however, it is preferable that the ratio of tetragonal crystals be as large as possible. As a result, it is possible for the internal stress of the piezoelectric layer 70 to be a tensile stress. In the case where less than 50% of the crystal structure of the piezoelectric material is a tetragonal crystal, that is, in a case where 50% or more has a crystal structure other than a tetragonal crystal structure or an amorphous (non-crystalline) structure, controlling the initial deflection position becomes difficult.

In general, it is possible to control the crystal structure of the piezoelectric material according to the material composition, manufacturing method, or the like. In the present embodiment, conditions for factors other than the liquid phase method may be set as appropriate. For example, in the case of using the piezoelectric material described above, it is necessary to use a material composition that allows 50% or more of the crystal structure to be a tetragonal crystal. In addition, it is necessary to set 50% or more of the crystal structure to be tetragonal by appropriately selecting the heating conditions (temperature, time, temperature increase and temperature decrease rate, apparatus, atmosphere, and the like) for crystallization after film formation, external stress, external pressure, substrate material, and the like.

In the present embodiment, the crystal orientation of the piezoelectric material forming the piezoelectric layer 70 is preferentially oriented in the (100) direction, and the crystal structure is tetragonal, whereby the internal stress is set to be tensile stress. Accordingly, by configuring the vibrating section of the piezoelectric element 300 so that the relationship of the total thicknesses $T_1$ and $T_2$ described above satisfies $T_1 \geq T_2$, the initial deflection position of the piezoelectric element 300 is made to be upwardly convex. In order to make the internal stress of the piezoelectric layer 70 tensile stress, it is preferable to form the piezoelectric layer 70 as a film by the liquid phase method. By forming the film by the liquid phase method, making the orientation of the crystal of the piezoelectric material (100) orientation, and making the crystal structure tetragonal, the internal stress is more easily set to tensile stress.

Next, a description will be given of an example of a method for manufacturing the piezoelectric element 300 with reference to the drawings together with a method for manufacturing the recording head 1. FIG. 8 to FIG. 14 are cross-sectional views illustrating a manufacturing example of the ink jet recording head.

Figure 8:
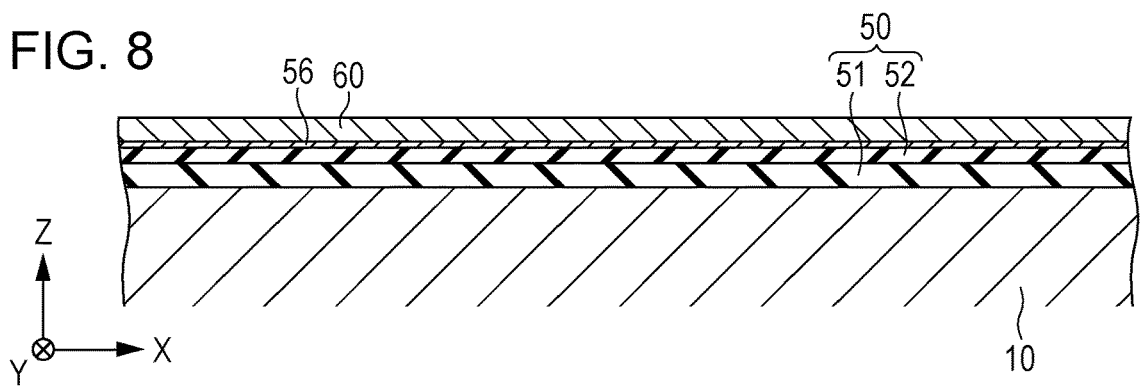
FIG. 8 is a cross-sectional view illustrating a manufacturing example of the ink jet recording head.

First, as shown in FIG. 8, a Si single crystal substrate is prepared as the substrate 10. Next, the substrate 10 is thermally oxidized to form the elastic film 51 made of $SiO_2$ on the surface thereof. Furthermore, a zirconium film is formed on the elastic film 51 by a sputtering method, an evaporation method, or the like, and the insulating film 52 made of $ZrO_2$ is obtained by thermal oxidation thereof. In this manner, the vibrating plate 50 formed of the elastic film 51 and the insulating film 52 is formed on the substrate 10. Next, the adhesive layer 56 formed of $TiO_x$ is formed on the insulating film 52. It is possible to form the adhesive layer 56 by a sputtering method, a thermal oxidation of a Ti film, or the like. Next, the first electrode 60 formed of Pt is formed on the adhesive layer 56. It is possible to appropriately select the first electrode 60 according to the electrode material, and for example, it is possible to form the first electrode 60 by vapor phase film formation such as a sputtering method, a vacuum vapor deposition method (PVD method), or a laser ablation method, liquid phase film formation such as a spin coating method, and the like.

Figure 9:
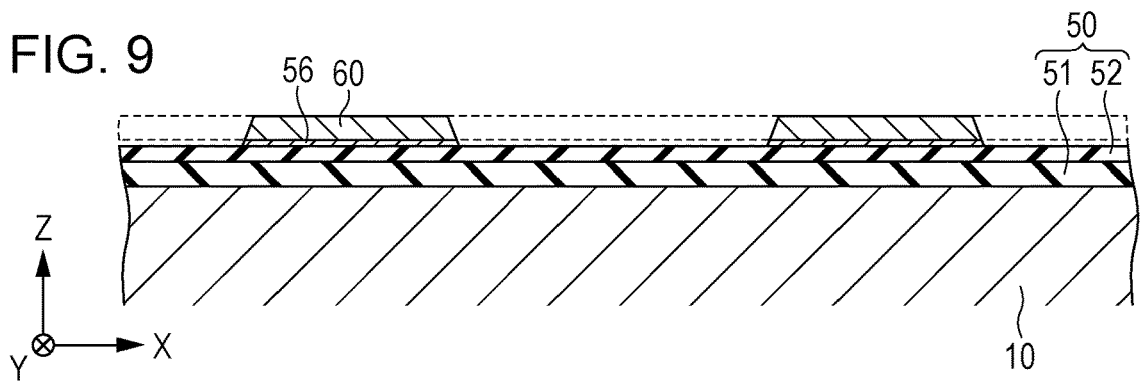
FIG. 9 is a cross-sectional view illustrating a manufacturing example of the ink jet recording head.

Next, as shown in FIG. 9, a resist (not shown) having a predetermined shape is formed on the first electrode 60 as a mask, and the adhesive layer 56 and the first electrode 60 are simultaneously patterned. It is possible to perform the patterning of the adhesive layer 56 and the first electrode 60, for example, by dry etching such as reactive ion etching (RIE), ion milling, or wet etching using an etching solution. The shapes of the adhesive layer 56 and the first electrode 60 in the patterning are not particularly limited.

Figure 10:
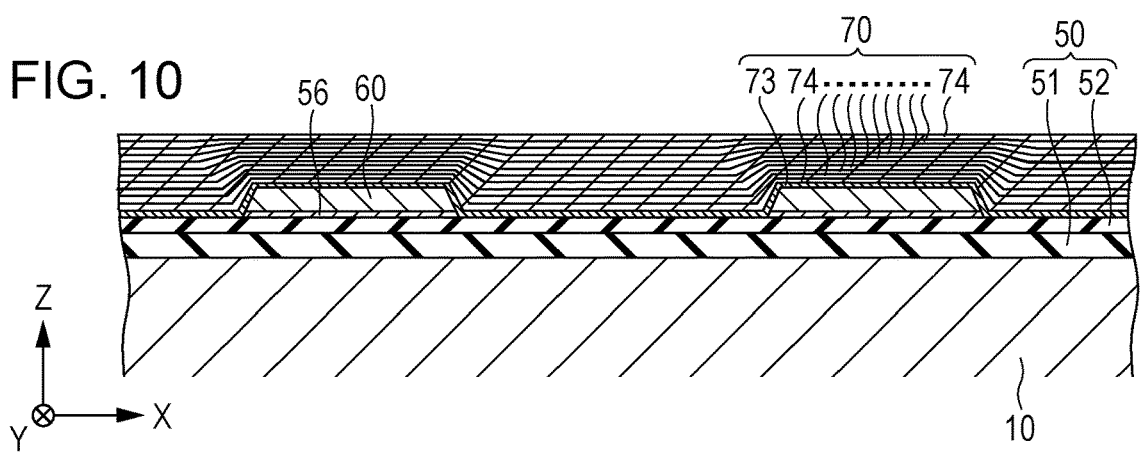
FIG. 10 is a cross-sectional view illustrating a manufacturing example of the ink jet recording head.

Next, as shown in FIG. 10, after the seed layer 73 is formed on the first electrode 60, a plurality of layers of piezoelectric films 74 are formed. The piezoelectric layer 70 is formed of the seed layer 73 and a plurality of layers of the piezoelectric films 74. It is possible to form the piezoelectric layer 70, for example, by a chemical solution method (wet method) in which a solution containing a metal complex (precursor solution) is coated and dried and further fired at a high temperature to obtain a metal oxide. In addition, it is also possible to form the piezoelectric layer 70 by a laser ablation method, a sputtering method, a pulse laser deposition method (PLD method), a Chemical Vapor Deposition (CVD) method, an aerosol deposition method, or the like. In the present embodiment, a wet method (liquid phase method) was used from the viewpoint of orienting the crystal orientation of the piezoelectric layer 70 in the (100) direction and making the crystal structure a tetragonal crystal.

Here, the wet method (liquid phase method) is a method of forming a film by a chemical solution method such as an MOD method or a sol-gel method, and is a concept distinguished from a vapor phase method such as a sputtering method. In general, in a case where a film is formed using a sputtering method, since the plane orientation of the film is oriented in the (100) direction, the internal stress of the film does not become tensile stress; however, a gas phase method may be used as long as it is possible to orient the plane orientation in the (100) direction, to set the crystal structure as a tetragonal crystal, and to form the piezoelectric layer 70 having internal stress which is tensile stress.

For example, although a description will be given below of the piezoelectric layer 70 formed by a wet method (liquid phase method); however, there is the seed layer 73 and a plurality of piezoelectric films 74 formed by a series of steps including a step (coating step) of applying a precursor solution to form a precursor film, a step of drying the precursor film (drying step), a step of heating and degreasing the dried precursor film (degreasing step), and a step of firing the degreased precursor film (firing step). That is, the piezoelectric layer 70 is formed by repeating the series of steps from the coating step to the firing step a plurality of times. Here, in the series of steps described above, after the coating step to the degreasing step are repeated a plurality of times, the firing step may be carried out.

Layers and films formed by a wet method have interfaces. In the layer or film formed by the wet method, traces of the coating or firing remain and such traces are interfaces which are able to be confirmed by being observed in the cross-section or analysis of the concentration distribution of elements in the layer (or in the film). Strictly speaking, the interface means a boundary between layers or between films, but here the interface means in the vicinity of a boundary of a layer or a film. In a case where a cross-section of a layer or a film formed by a wet method is observed with a microscope or the like, such an interface is confirmed as a portion where the color is darker than the other portions or a portion where the color is lighter than the other portion in the vicinity of the boundary with the adjacent layer or film. In addition, in a case of analyzing the concentration distribution of elements, such an interface is confirmed as a portion having a higher concentration of elements than other portions or a portion having a lower element concentration than the other portions in the vicinity of the boundary with the adjacent layer or film. The piezoelectric layer 70 is formed (formed of the seed layer 73 and a plurality of layers of the piezoelectric film 74) by repeating a series of steps from a coating step to a firing step a plurality of times, or repeating a coating step to a degreasing step a plurality of times and then performing a firing step, thus, there are a plurality of interfaces corresponding to the seed layer 73 and each of the respective piezoelectric films 74.

An example of a specific procedure in a case where the piezoelectric layer 70 is formed by a wet method is as follows. First, precursor solutions formed of a MOD solution including a metal complex or a sol for forming the piezoelectric layer 70 are respectively adjusted (adjustment step). Then, the precursor solution of the piezoelectric layer 70 is coated on the patterned first electrode 60 by a spin coating method or the like to form a precursor film (coating step). Next, the precursor film is heated to, a predetermined temperature, for example, approximately 130° C. to 250° C. and dried for a certain period of time (drying step), and the dried precursor film is degreased by being further heated to a predetermined temperature, for example, approximately 300° C. to 450° C. and being held for a certain period of time (degreasing step). Further, the degreased precursor film is crystallized by being heated to a higher temperature, for example, from approximately 500° C. to 800° C., and held at this temperature for a certain period of time, thereby forming the seed layer 73 (firing step). After the seed layer 73 is formed, the coating step, drying step, degreasing step and firing step described above are repeated a plurality of times to form the piezoelectric layer 70 formed of the seed layer 73 and the plurality of layers of the piezoelectric films 74.

Each of the precursor solutions described above is obtained by dissolving or dispersing a metal complex capable of forming the perovskite-type composite oxide described above by firing in an organic solvent. That is, the precursor solution of the piezoelectric layer 70 includes a predetermined element as the central metal of the metal complex. At this time, a metal complex including an element other than the above element may be further mixed in the precursor solution of the piezoelectric layer 70. In the present embodiment, a metal complex including each of Bi, Fe and Ta was used as an element forming the seed layer 73. In addition, a metal complex including each of Pb, Mg, Nb, and Ti, or a metal complex including each of Pb, Zr, and Ti, respectively, was used as an element forming the piezoelectric film 74.

As the metal complex including each of the elements described above, it is possible to use, for example, an alkoxide, an organic acid salt, a β-diketone complex or the like. In each of the precursor solutions described above, the mixing ratio of these metal complexes may be mixed such that each of the predetermined elements included in the perovskite-type composite oxide have a desired molar ratio.

Examples of the metal complex including Bi include bismuth 2-ethylhexanoate, bismuth acetate, and the like. Examples of the metal complex including Fe include iron 2-ethylhexanoate, iron acetate, tris (acetylacetonate) iron, and the like. Examples of the metal complex including Ta include pentaethoxytantalum and the like. Examples of the metal complex including Pb include lead acetate and the like. Examples of the metal complex including Mg include magnesium 2-ethylhexanoate and the like. Examples of the metal complex including Nb include niobium 2-ethyl-hexanoate, pentaethoxy niobium, and the like. Examples of the metal complex including Ti include titanium alkoxides such as titanium isopropoxide, titanium 2-ethylhexanoate, titanium acetate, and the like. Examples of metal complexes including Zr include zirconium acetylacetonate, zirconium tetraacetylacetonate, zirconium monoacetylacetonate, zirconium bisacetylacetonate, and the like. At this time, two or more kinds of metal complexes may be used in combination.

Examples of the organic solvent used for preparing the precursor solution include propanol, butanol, pentanol, hexanol, octanol, ethylene glycol, propylene glycol, octane, decane, cyclohexane, xylene, toluene, tetrahydrofuran, acetic acid, octylic acid, 2-n-butoxyethanol, n-octane and the like, mixed solvents thereof, and the like.

The precursor solution may include additives which stabilize the dispersion of each metal complex. Examples of such additives include 2-ethylhexanoic acid, diethanolamine, and the like.

Examples of the heating apparatus used in the drying step, the degreasing step and the firing step include a Rapid Thermal Annealing (RTA) apparatus heated by irradiation with an infrared lamp, a hot plate, and the like.

Figure 11:
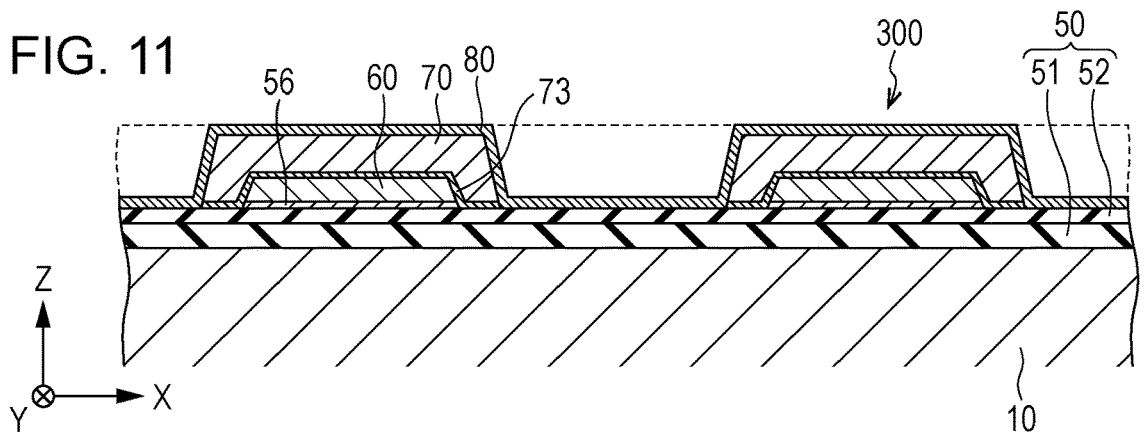
FIG. 11 is a cross-sectional view illustrating a manufacturing example of the ink jet recording head.

Next, as shown in FIG. 11, the piezoelectric layer 70 formed of the seed layer 73 and the plurality of layers of the piezoelectric films 74 is patterned. It is possible to perform the patterning by dry etching such as reactive ion etching or ion milling or wet etching using an etching solution. The shape of the piezoelectric layer 70 in the patterning is not particularly limited. Thereafter, the second electrode 80 formed by laminating Pt and Ir is formed on the patterned piezoelectric layer 70. It is possible to form the second electrode 80 by the same method as the first electrode 60.

In the present embodiment, the thickness of each element is determined such that the total thickness $T_1$ from the vibrating plate 50 to the first electrode 60 and the total thickness $T_2$ from the seed layer 73 to the second electrode 80 satisfy the relationship of $T_1 \geq T_2$ (refer to FIG. 5).

Here, a reheating treatment (post annealing) may be performed before and after the formation of the second electrode 80 on the piezoelectric layer 70 in a temperature range of approximately 600° C. to 800° C. as necessary. Performing post annealing in this manner makes it possible to form good interfaces between the adhesive layer 56 and the first electrode 60, the first electrode 60 and the piezoelectric layer 70, and between the piezoelectric layer 70 and the second electrode 80, and to improve the crystallinity of the piezoelectric layer 70.

Figure 12:
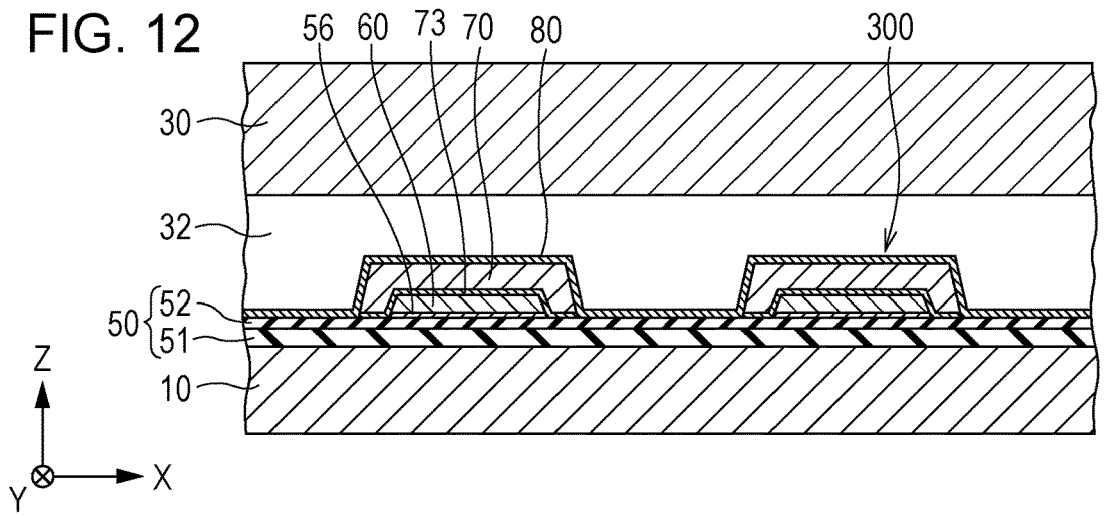
FIG. 12 is a cross-sectional view illustrating a manufacturing example of the ink jet recording head.

Next, as shown in FIG. 12, the protective substrate 30 is bonded as a protective substrate wafer to the surface of the substrate 10 on the piezoelectric element 300 side via the adhesive 35 (refer to FIG. 4). Thereafter, the surface of the protective substrate 30 is thinned by scraping. In addition, the manifold portion 32 and the through hole 33 (refer to FIG. 4) are formed in the protective substrate 30.

Figure 13:
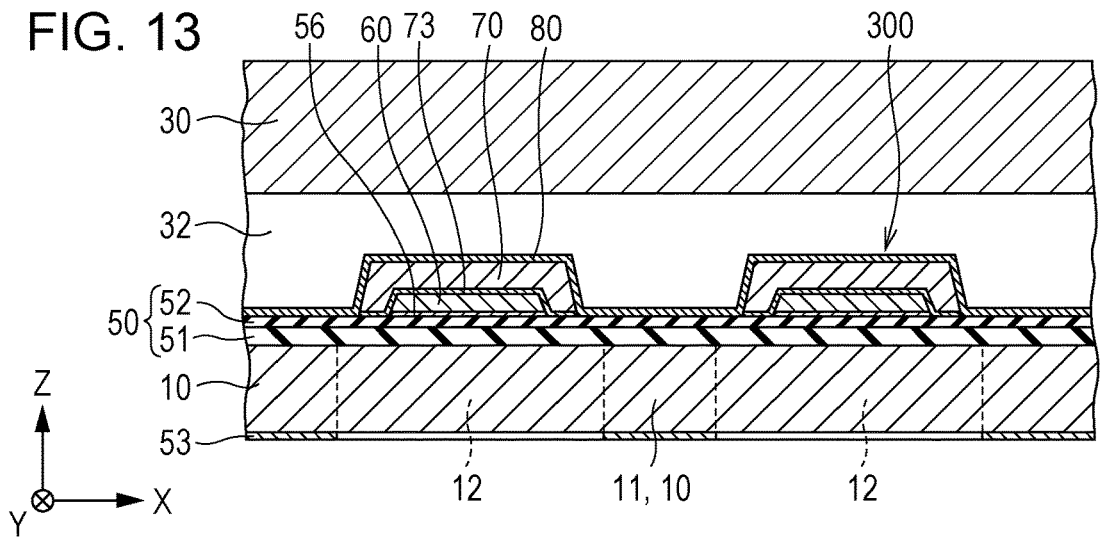
FIG. 13 is a cross-sectional view illustrating a manufacturing example of the ink jet recording head.
Figure 14:
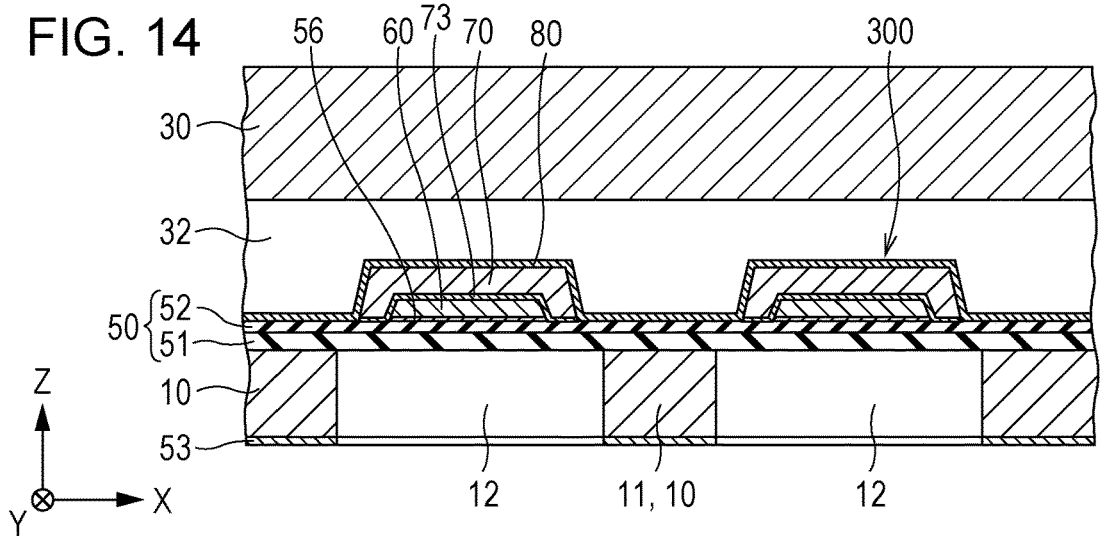
FIG. 14 is a cross-sectional view illustrating a manufacturing example of the ink jet recording head.

Next, as shown in FIG. 13, a mask film 53 is formed on the surface of the substrate 10 on the opposite side to the piezoelectric element 300, and is patterned into a predetermined shape. Then, as shown in FIG. 14, anisotropic etching (wet etching) using an alkaline solution such as KOH is performed on the substrate 10 via the mask film 53, whereby the substrate 10 is divided by the plurality of partition walls 11 to form the pressure generating chambers 12. Furthermore, in addition to the pressure generating chambers 12 corresponding to the individual piezoelectric elements 300, the ink supply path 13, the communication passage 14, and the communication portion 15 (refer to FIG. 4) are formed.

Next, unnecessary portions of the outer peripheral edges of the substrate 10 and the protective substrate 30 are cut and removed by dicing or the like. Furthermore, the nozzle plate 20 is bonded to the surface of the substrate 10 on the opposite side to the piezoelectric element 300. In addition, the compliance substrate 40 is bonded to the protective substrate 30. By the steps so far, the assembly of the chips of the recording head 1 is completed. The recording head 1 is obtained by dividing this aggregate into individual chips.

Second Embodiment

Ultrasonic Device

Next, a description will be given of an ultrasonic probe which is an example of an ultrasonic device on which an ultrasonic sensor according to a second embodiment of the invention is mounted with reference to the drawings.

Figure 15:
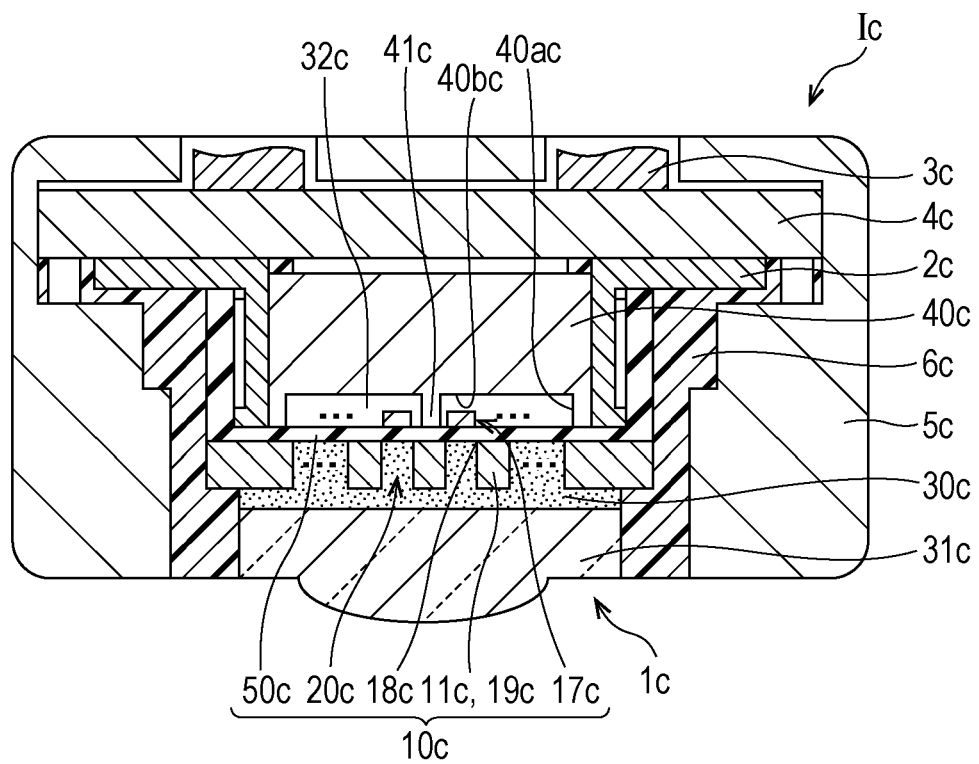
FIG. 15 is a cross-sectional view showing a configuration example of an ultrasonic probe.

FIG. 15 is a cross-sectional view showing a configuration example of the ultrasonic probe. As shown in the diagram, the ultrasonic probe (probe) Ic is provided with a CAV surface-type ultrasonic sensor 1c, a flexible printed circuit board (FPC board 2c) connected to the ultrasonic sensor 1c, a cable 3c pulled out from an apparatus terminal (not shown), a relay substrate 4c for relaying the FPC board 2c and the cable 3c, a housing 5c for protecting the ultrasonic sensor 1c, the FPC board 2c, and the relay substrate 4c, a waterproof resin 6c filled between the housing 5c and the ultrasonic sensor 1c. In addition, as will be described in detail below, the ultrasonic sensor 1c is configured to include an acoustic matching layer 30c for propagating ultrasonic waves generated by driving an ultrasonic element 10c, a lens member 31c as a refracting member for refracting the ultrasonic wave, and an enveloping plate 40c. Here, the probe Ic is not limited to the configuration described above and may be configured to include other elements as necessary.

The ultrasonic sensor 1c mounted on the probe Ic is configured to have integrated with transmission and reception. In the ultrasonic sensor 1c, transmission ultrasonic waves are transmitted through the acoustic matching layer 30c and the lens member 31c according to the repeated transmission period of the ultrasonic sensor 1c. As the transmission ultrasonic waves are transmitted at predetermined intervals, reflected ultrasonic waves reflected from the measurement object are received through the acoustic matching layer 30c and the lens member 31c. Based on waveform signals of these transmission ultrasonic waves and reflected ultrasonic waves, information (position, shape, and the like) relating to the measurement object is detected in the apparatus terminal of the probe Ic.

According to the ultrasonic sensor 1c, it is possible to suppress variations in transmission and reception sensitivity and to improve the reception sensitivity. Accordingly, by mounting the ultrasonic sensor 1c on the probe Ic, the probe Ic having excellent detection sensitivity is obtained. The ultrasonic sensor 1c is not limited to a transmission and reception integral-type sensors and is also able to be applied to transmission only type sensors, reception only type sensors, and the like. The probe Ic which is able to have the ultrasonic sensor 1c mounted thereon is not limited to this configuration.

In addition, the ultrasonic sensor 1c is not limited to a type (CAV surface type) in which the side opposite to a piezoelectric element 17c of a vibrating plate 50c is an ultrasonic wave passage region, and it is also possible to apply the ultrasonic sensor 1c to a type (ACT surface type) in which the piezoelectric element 17c side of the vibrating plate 50c is an ultrasonic wave passage region. Compared with the ultrasonic sensor on the ACT surface side, in the CAV surface type ultrasonic sensor 1c, the piezoelectric element 17c forming the ultrasonic element 10c is at a position separated from the measurement object. Accordingly, it is extremely difficult for moisture from outside to reach the piezoelectric element 17c, and the ultrasonic sensor 1c is excellent in electrical safety during use. Moreover, in a case where the piezoelectric element 17c is a thin film, it is also possible to improve the handling property at the time of manufacture, thus the handling of the ultrasonic sensor 1c becomes easy.

Ultrasonic Sensor

Figure 16:
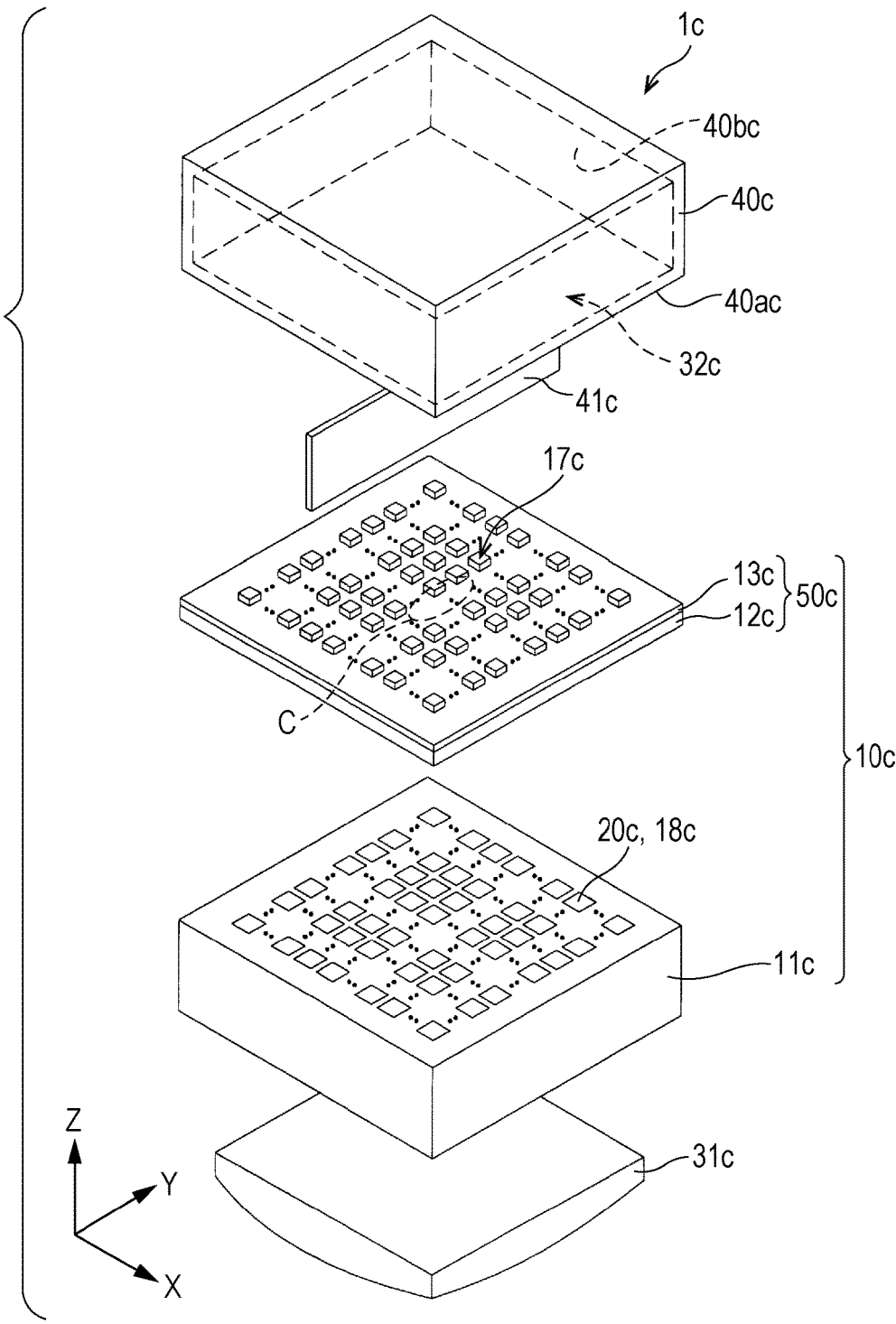
FIG. 16 is an exploded perspective view showing a configuration example of an ultrasonic sensor.

FIG. 16 is an exploded perspective view of the ultrasonic sensor. As shown in FIG. 15 and FIG. 16, the ultrasonic sensor 1c is formed to include the ultrasonic element 10c, the acoustic matching layer 30c, the lens member 31c, and the enveloping plate 40c. In FIG. 16, the enveloping plate 40c and a support member 41c are shown as separate bodies, but in practice, as shown in FIG. 15, both are formed integrally. The ultrasonic sensor 1c is not limited to the configuration described above, and may be formed to include other elements.

Since the ultrasonic sensor 1c is configured as a CAV surface type, the acoustic matching layer 30c is provided in a space 20c. Resin or the like having an acoustic matching capability is filled in the space 20c or the like of a substrate 11c to form the acoustic matching layer 30c making it possible to prevent the acoustic impedance from rapidly changing between the ultrasonic element 10c and the measurement object and, as a result, it is possible to prevent a reduction in propagation efficiency of ultrasonic waves. Examples of a material applicable to the acoustic matching layer 30c include a material (fluid material) having fluidity such as a silicone-based material such as silicone oil, silicone resin, or silicone rubber. However, the material applicable to the acoustic matching layer 30c is not limited to the example described above, and it is possible to appropriately select and use the material depending on the application of the ultrasonic sensor 1c or the like.

The lens member 31c is provided on the opposite side of the vibrating plate 50c on the substrate 11c. The lens member 31c has a role of causing ultrasonic waves to converge. In a case where the ultrasonic waves are converged by an electronic focusing method or the like, it is possible to omit the lens member 31c. In addition, it is possible to replace the lens member 31c with a protective plate or the like which does not have an ultrasonic wave convergence function. In the present embodiment, the acoustic matching layer 30c described above also has a bonding function or an adhesion function between the lens member 31c and the substrate 11c. The acoustic matching layer 30c is interposed between the lens member 31c and the substrate 11c to form the ultrasonic sensor 1c. It is possible to form the lens member 31c of the same material as the silicone-based material or the like of the acoustic matching layer 30c described above. However, the material applicable to the lens member 31c is not limited to the above example and it is possible to appropriately select and use a material depending on the use of the ultrasonic sensor 1c and the like. Using the same material as the acoustic matching layer 30c makes it possible to easily bond or adhere the acoustic matching layer 30c and the lens member 31c.

The enveloping plate 40c is provided on an insulating film 13c side of the vibrating plate 50c. A concave portion (piezoelectric element holding portion 32c) is formed at the center of the enveloping plate 40c, and the periphery of this piezoelectric element holding portion 32c is surrounded by an edge 40ac and a surface 40bc of the enveloping plate 40c. A region at the periphery of the ultrasonic element 10c (a region including the upper surface and the side surface of the ultrasonic element 10c) is covered by the piezoelectric element holding portion 32c. Accordingly, the upper surface of the ultrasonic element 10c is covered with the surface 40bc of the enveloping plate 40c, and the side surface is covered with the edge 40ac.

The thickness of the piezoelectric element holding portion 32c in the Z direction is 80 μm, but the thickness is not limited to the above value. The thickness of the piezoelectric element holding portion 32c in the Z direction may be any value as long as a space is secured such that the driving of the ultrasonic element 10c is not hindered. In addition, the piezoelectric element holding portion 32c may be filled with the atmosphere or with air (dry air), or may be filled with resin. Alternatively, the piezoelectric element holding portion 32c may be filled with a type of sealed gas such as nitrogen ($N_2$) or argon (Ar), and it is possible to freely select the type of sealed gas and the pressure.

The enveloping plate 40c is adhered or bonded to the vibrating plate 50c via the edge 40ac and the support member 41c described below. It is possible to use an adhesive or the like for adhesion or bonding of the enveloping plate 40c, without being limited to the above example. The thickness of the enveloping plate 40c in the Z direction is 400 μm, but is not limited to the above value.

In the ultrasonic sensor 1c, the support member 41c is provided between the surface 40bc of the enveloping plate 40c and the insulating film 13c of the vibrating plate 50c, and at a position not overlapping with the ultrasonic element 10c and it is possible to support the vibrating plate 50c using the support member 41c. Therefore, for example, when mounting the lens member 31c on the ultrasonic element 10c or when securing the adhesion between the ultrasonic element 10c and the lens member 31c, the lens member 31c may be pressed to the acoustic matching layer 30c side. Even in a case where the lens member 31c is not provided or in a case where another member is provided in place of the lens member 31c, in order to secure the adhesiveness of each member, a pressing force may be applied to the vibrating plate 50c from the acoustic matching layer 30c side. Since the ultrasonic sensor 1c is formed to be provided with the support member 41c, as described above, even if a predetermined external pressure is applied to the vibrating plate 50c, it is possible to suppress the occurrence of structural distortion and to ensure high reliability.

In addition, since the support member 41c is provided between the piezoelectric elements 17c so as to not overlap with the piezoelectric element 17c, it is avoided that the piezoelectric element 17c is excessively restrained by the support member 41c. Therefore, it is also possible to prevent the transmission efficiency and reception efficiency of the ultrasonic waves from being excessively reduced as compared with a case where the support member 41c is not provided. The support member 41c is adhered or bonded to the ultrasonic element 10c side with an adhesive or the like, but this method is not limited to the previous example.

The support member 41c has a beam shape extending in the Y direction. According to this, it is possible to support the vibrating plate 50c over a wide range in the Y direction. The beam-shaped support member 41c may extend in the X direction instead of in the Y direction. The beam-shaped support member 41c may have one extending end separated from the edge 40ac of the enveloping plate 40c. The support member is included in the beam-shaped support member 41c of the invention as long as at least one end in the extending direction is in contact with the edge 40ac of the enveloping plate 40c.

Naturally, the support member 41c may not have a beam shape. The support member 41c may not be linear in the extending direction. Although the cross-sectional area of the support member 41c in the XY plane may differ in the Z direction depending on the method for manufacturing the support member 41c, these cases are included in the support member 41c of the invention as long as it is possible to support the vibrating plate 50c.

The center portion of the piezoelectric element holding portion 32c is relatively distant from the edge 40ac of the enveloping plate 40c. Accordingly, at a center location C corresponding to the center portion of the piezoelectric element holding portion 32c in the vibrating plate 50c, the rigidity of the vibrating plate 50c tends to be low in a case where there is no support member 41c. Therefore, the support member 41c is provided in the center portion of the piezoelectric element holding portion 32c so as to support the center location C of the vibrating plate 50c. Due to this, it is possible to secure a higher reliability.

In the ultrasonic sensor 1c, it is possible to variously select the number, arrangement, shape, and the like of the support members 41c. For example, a plurality of support members 41c may be provided. In such a case, it is preferable that the support members 41c be provided at equal intervals in the piezoelectric element holding portion 32c. According to this, it is possible to support the vibrating plate 50c all over. Accordingly, it is preferable that the number of the vibrating plates 50c be an odd number of three or more. This is because when the support members 41c are provided at equal intervals in the piezoelectric element holding portion 32c, it is possible to position the middle support member 41c in the vicinity of the center location C of the vibrating plate 50c. For example, when the number of support members 41c is around 3, the balance is good. Naturally, the support members 41c may be provided only at portions shifted from the central location C of the vibrating plate 50c.

The beam-shaped support member 41c is manufactured by wet etching the enveloping plate 40c. In this manner, the support member 41c is manufactured by making use of the constituent material of the enveloping plate 40c, and has the same configuration as the enveloping plate 40c. Although wet etching is inferior in processing accuracy to, for example, dry etching, since it is possible to cut many regions in a short time, it is a preferable technique for manufacturing the beam-shaped support member 41c.

A plurality of partition walls 19c are formed on the substrate 11c. A plurality of cavities (CAV) (referred to below as "spaces 20c") are defined by the plurality of partition walls 19c in the X direction and the Y direction. The space 20c is formed to penetrate the substrate 11c in the thickness direction (Z direction). That is, the substrate 11c is formed with openings 18c which are open toward the vibrating plate 50c side thereof. A plurality of the openings 18c are formed two-dimensionally, that is, in the X direction and the Y direction. It is possible to variously modify the arrangement and shape of the opening 18c. For example, a plurality of openings 18c may be formed one dimensionally, that is, in one of the X direction or the Y direction. In addition, the opening 18c may be formed in a square shape (the ratio of the length in the X direction and the length in the Y direction is 1:1) when the piezoelectric element 17c is viewed from the vertical direction (Z direction), or may be formed in a rectangular shape (the ratio of the length in the X direction and the length in the Y direction is other than 1:1).

It is possible to form the ultrasonic element 10c as the deflection displacement-type piezoelectric element in the same manner as the piezoelectric element 300 of the first embodiment, but the ultrasonic element 10c may be formed to include other elements as necessary. In the description of the ultrasonic element, overlapping description of the piezoelectric element 300 will be appropriately omitted.

Normally, in the ultrasonic sensor, the ultrasonic element is arranged two-dimensionally in the X direction and in the Y direction orthogonal to the X direction, and the X direction is the scanning direction, and the Y direction is the slicing direction. In the configuration example of the present embodiment, sixteen ultrasonic elements 10c are lined up in the Y direction which is the slicing direction, and 64 ultrasonic elements 10c are lined up in the X direction which is the scanning direction, and FIG. 16 shows only one part thereof. In the ultrasonic sensor 1c, it is possible to continuously acquire sensing information in the slicing direction in the scanning direction by driving in each row extending in the slicing direction (Y direction), that is, by performing transmission and reception of ultrasonic waves while scanning in the scanning direction (X direction).

Here, for the materials of each configuration of the enveloping plate 40c, the support member 41c, and the ultrasonic element 10c, for example, it is possible to apply the same materials as for each configuration of the protective substrate 30 and the piezoelectric element 300 of the first embodiment.

EXAMPLES

A more specific description will be given below of the invention with reference to examples. The invention is not limited to the following examples.

Example 1

First, a 6-inch (100) plane Si single crystal substrate (substrate 11c) was thermally oxidized to form an $SiO_2$ film (elastic film 12c) on the surface of the Si single crystal substrate. A zirconium film was formed on the $SiO_2$ film by a sputtering method and the zirconium film was thermally oxidized to form a $ZnO_2$ film (insulating film 13c). Next, a Ti layer was formed on the $ZnO_2$ film by an RF magnetron sputtering method, and the Ti layer was thermally oxidized to form a $TiO_x$ layer (adhesive layer). Next, a Pt electrode film was formed on the $TiO_x$ layer by an RF magnetron sputtering method. Subsequently, a predetermined photoresist pattern was formed on the Pt electrode film, and the Pt electrode film and the $TiO_x$ layer were patterned into predetermined shapes by ion milling to form a Pt electrode pattern (first electrode 14c pattern).

Next, a BFT layer (seed layer) was formed on the Pt electrode pattern by the following procedure. First, propionic acid, bismuth acetate, iron acetate, and titanium tetra-i-propoxide were weighed in a container and heated and stirred at 140° C. for 2 hours to prepare a BFT precursor solution.

Next, the BFT precursor solution was applied on the Si single crystal substrate having the Pt electrode pattern formed thereon by a spin coating method (coating step). Next, the Si single crystal substrate was placed on a hot plate and dried and degreased at 350° C. (drying step and degreasing step). Then, firing was performed at 650° C. by the RTA apparatus (firing step) to form one BFT layer. In Example 1, the thickness of the BFT layer was set to 40 nm.

Next, a PMN-PT layer (piezoelectric layer 15c) was formed on the BFT layer by the following procedure. First, 2-butoxyethanol and dimethylaminoethanol were weighed into a container to prepare a mixed solution X. Next, titanium tetra-i-propoxide and niobium penta-n-butoxide were weighed into a container in a glove box filled with dry nitrogen and mixed in a mixed solution X to obtain a mixed solution Y. Next, after sufficiently stirring the mixed solution Y at room temperature, magnesium acetate and lead acetate were weighed out into a container in the atmosphere, mixed in the mixed solution Y, and stirred to prepare a PMN-PT precursor solution. Here, titanium tetra-i-propoxide, niobium penta-n-butoxide, magnesium acetate and lead acetate were prepared in accordance with a composition represented by General Formula ($xPb_{1+\alpha}$ ($Mg_{0.33}$, $Nb_{0.67}$) $O3$-$(1-x)$ $Pb_{1+\alpha}$ $TiO_3$), such that x and α in General Formula have a ratio (composition) with the molar ratio of PMN shown in Table 1 below.

Next, the PMN-PT precursor solution was coated on the Si single crystal substrate having the BFT layer formed thereon by a spin coating method (coating step). Next, the Si single crystal substrate was placed on a hot plate and dried at 180° C. (drying step). Next, the Si single crystal substrate was degreased on a hot plate at 380° C. (degreasing step). Then, firing was performed at 750° C. by the RTA apparatus (firing step) to form a single layer of a PMN-PT film (piezoelectric film). Thereafter, the firing step was repeated 16 times from the coating step described above to form a total of 17 layers of PMN-PT films to form a PMN-PT layer. In Example 1, the thickness of the PMN-PT layer was 1.0 μm.

Next, a Pt electrode film having a thickness of 20 nm was formed on the PMN-PT layer by a sputtering method, and a baking treatment was performed at 650° C. by an RTA apparatus. Next, a predetermined photoresist pattern was formed on the Pt electrode film, and the Pt electrode film, the PMN-PT layer, and the BFT layer were patterned into predetermined shapes by ion milling. Then, an Ir electrode film having a thickness of 40 nm is formed thereon by a sputtering method, a predetermined photoresist pattern is formed on the Ir electrode film, and the Ir electrode film is patterned into a predetermined shape by ion milling to form an Ir/Pt electrode pattern (second electrode 16c pattern) was formed.

Next, the thickness of the Si single crystal substrate was set to 150 μm by scraping the surface (rear surface) on the opposite side to the surface of the Si single crystal substrate on which the Ir/Pt electrode pattern and the like are formed by polishing treatment. Next, a predetermined photoresist pattern is formed on the polished surface, and a cavity (CAV) structure (space 20c) is formed by inductively coupled plasma (IcP) etching to obtain a deflection vibration type piezoelectric element (piezoelectric element 17c).

Here, in the obtained deflection vibration type piezoelectric element, the total thickness $T_1$ of 1.7 μm with the vibrating plate formed of the $ZnO_2$ film and the $SiO_2$ film, the $TiO_x$ layer, and the Pt electrode film, and the total thickness $T_2$ of the BFT layer, the PMN-PT layer, the Pt electrode film, and the Ir electrode film was 1.1 μm. That is, in Example 1, a deflection vibration type piezoelectric element in which each film and each layer in the vibrating section had a relationship of $T_1 \geq T_2$ was obtained.

Example 2, Comparative Example 1, and Comparative Example 2

A deflection vibration type piezoelectric element (piezoelectric element 17c) was obtained in the same manner as Examples 1 except that titanium tetra-i-propoxide, niobium penta-n-butoxide, magnesium acetate, and lead acetate were respectively prepared in accordance with a composition represented by General Formula ($xPb_{1+\alpha}$ ($Mg_{0.33}$, $Nb_{0.67}$) $O3$-$(1-x)$ $Pb_{1+\alpha}$ $TiO_3$), such that x and α in General Formula have a ratio (composition) with the molar ratio of PMN shown in Table 1 below.

Example 3, Example 4, and Comparative Example 3 to Comparative Example 5

First, in the same manner as in Example 1, an $SiO_2$ film, a $ZnO_2$ film, a $TiO_x$ layer, and a Pt electrode film were sequentially formed on a Si single crystal substrate. Next, an Ir electrode film was formed on the Pt electrode film by a sputtering method, a Ti layer was formed on the Ir electrode film by an RF magnetron sputtering method, and the Ti layer was thermally oxidized to form a $TiO_x$ layer. Next, a predetermined photoresist pattern was formed on the $TiO_x$ layer, and the $TiO_x$ layer, the Ir electrode film, the Pt electrode film, and the $TiO_x$ layer were patterned into predetermined shapes by ion milling to form an Ir/Pt electrode pattern (first electrode 14c pattern).

Next, a PZT layer (piezoelectric layer 15c) was formed on the Ir/Pt electrode pattern by the following procedure. First, acetic acid and water were weighed in a container, then lead acetate, zirconium butoxide, titanium tetra-i-propoxide and polyethylene glycol were weighed in another container and these were heated and stirred at 90° C., to prepare a PZT precursor solution. Next, a PZT layer was formed in the same manner as in Example 1 except that the PZT precursor solution was used, the drying temperature was 140° C., the degreasing temperature was 370° C., and the firing temperature was 737° C. In Examples 3 and 4 and Comparative Examples 3 to 5, the thickness of the PZT layer was 0.7 μm. In addition, lead acetate, zirconium butoxide, and titanium tetra-i-propoxide were respectively prepared in accordance with a composition represented by General Formula ($Pb_{1+\alpha}$ ($Zr_{1-x}$, $Ti_x$)$O_3$), such that x and α in General Formula have a ratio (composition) with the molar ratio of PZT shown in Table 1 below.

Next, a Ti layer having a thickness of 3 nm was formed on the PZT layer by an RF magnetron sputtering method, and the Ti layer was thermally oxidized to form a $TiO_x$ layer. Next, an Ir electrode film having a thickness of 4 nm was formed on the $TiO_x$ layer by a sputtering method, a predetermined photoresist pattern was formed on the Ir electrode film, and the Ir electrode film and the $TiO_x$ layer were patterned into predetermined shapes by ion milling to form an Ir electrode pattern (second electrode 16c pattern). Next, a CAV structure was prepared in the same manner as in Example 1 to obtain a deflection vibration type piezoelectric element (piezoelectric element 17c).

In the obtained deflection vibration type piezoelectric element, the total thickness $T_1$ of the vibrating plate formed of the $ZnO_2$ film and the $SiO_2$ film, the $TiO_x$ layer, the Pt electrode film, and the Ir electrode film was 800 μm, and the total thickness $T_2$ of the $TiO_x$ layer, the PZT layer, the $TiO_x$ layer, and the Ir electrode film was 750 μm. That is, in Examples 3 and 4 and Comparative Example 3 to Comparative Example 5, a deflection vibration type piezoelectric element in which each film and each layer in the vibrating section had a relationship of $T_1 \geq T_2$ was obtained.

TABLE 1

| | Seed layer | Piezo-electric layer | X | α | Crystal structure | Initial deflection amount d [nm] |
|---|---|---|---|---|---|---|
| Example 1 | BFT | PMN-PT | 0.25 | 0.14 | Tetragonal structure | +40 |
| Example 2 | BFT | PMN-PT | 0.30 | 0.14 | Tetragonal structure | +6 |
| Example 3 | — | PZT | 0.60 | 0.18 | Tetragonal structure | +56 |
| Example 4 | — | PZT | 0.65 | 0.18 | Tetragonal structure | +69 |
| Comparative Example 1 | BFT | PMN-PT | 0.50 | 0.14 | Pseudo cubic crystal | −75 |
| Comparative Example 2 | BFT | PMN-PT | 0.40 | 0.14 | Pseudo cubic crystal | −49 |
| Comparative Example 3 | — | PZT | 0.35 | 0.18 | Rhombohedral crystal | −70 |
| Comparative Example 4 | — | PZT | 0.40 | 0.18 | Rhombohedral crystal | −60 |
| Comparative Example 5 | — | PZT | 0.48 | 0.18 | Monoclinic crystal | −22 |

Structure Analysis

The orientation and crystal structure of the deflection vibration type piezoelectric elements of Example 1 to Example 4 and Comparative Example 1 to Comparative Example 5 were examined. Specifically, using a "D8 Discover" manufactured by Bruker AXS GmbH, a two-dimensional mapping image and a diffraction pattern were measured using a CuKα as a radiation source and a two-dimensional detector (GADDS) as a detector. Here, the crystal structure was determined from the presence or absence of the splitting of the peak derived from the (200) plane of the piezoelectric layer and a typical bulk phase diagram, and the results are shown in Table 1.

As a result, it was confirmed that Examples 1 to 4 were oriented in the (100) plane. The term "oriented in the (100) plane" in this specification is an expression of orientation and is expressed as a plane index when the perovskite structure represented by General Formula $ABO_3$ is regarded as a cubic crystal in a pseudo manner, which is different from the plane index in the actual crystal structure. For example, in the crystal structures shown in Examples 1 to 4 as shown in Table 1, "oriented in the (100) plane" means that one or both of the (100) plane and the (001) plane are aligned in a direction perpendicular to the Si single crystal substrate. On the other hand, in Comparative Example 1 to Comparative Example 5, "oriented in the (100) plane" means that the crystal structure takes a structure other than tetragonal and is not oriented in the (100) plane.

Shape Observation

The processed shape of the deflection vibration type piezoelectric element of Examples 1 to 4 was measured using an optical microscope and a scanning electron microscope (SEM). As a result, all the deflection vibration type piezoelectric elements had a predetermined shape, and no specific abnormalities affecting the characteristics were observed. Accordingly, it is clear that it is unnecessary to consider the element structure factor for subsequent measurement results.

Initial Deflection Measurement

Figure 17:
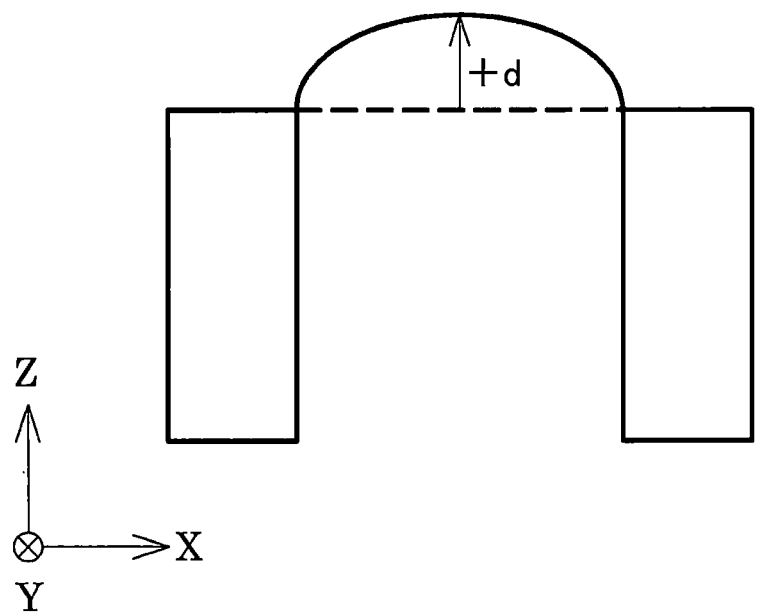
FIG. 17 is a view schematically showing the initial deflection amount of the deflection displacement-type piezoelectric element.
Figure 18:
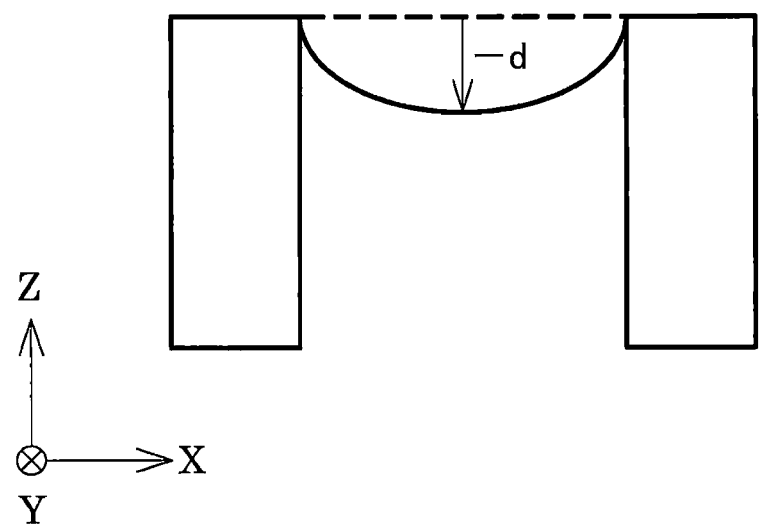
FIG. 18 is a view schematically showing the initial deflection amount of the deflection displacement-type piezoelectric element.

The deflection (initial deflection amount d) in the CAV structure of the deflection vibration type piezoelectric element of Example 1 to Example 4 and Comparative Example 1 to Comparative Example 5 in a state where no voltage is applied was measured using an "optical interferometric surface roughness measuring system NT 9300 DMEMS" manufactured by Veeco Instruments Inc. FIG. 17 and FIG. 18 are diagrams schematically showing initial deflection amounts of the deflection displacement-type piezoelectric element. A case where the deflection vibration type piezoelectric element is not deflected is set as zero, and, as shown in FIG. 17, the initial deflection amount d in a case where the deflection vibration type piezoelectric element is deflected to the opposite side with respect to the CAV surface (a case of being upwardly convex) is set to positive, while, as shown in FIG. 18, the initial deflection amount d in a case where the deflection vibration type piezoelectric element is deflected toward the CAV surface side (a case of being downwardly convex) was set to negative. Then, the measured initial deflection amounts d are shown in Table 1.

As shown in Table 1, in the deflection vibration type piezoelectric element of Example 1 to Example 4, the crystal structure was a tetragonal crystal and the initial deflection amount d was positive. That is, it is clear that the initial deflection positions of these deflection vibration type piezoelectric elements are upwardly convex. On the other hand, in the deflection vibration type piezoelectric elements of Comparative Example 1 to Comparative Example 5, the crystal structure was a pseudo cubic crystal, rhombohedral crystal, or monoclinic crystal other than a tetragonal crystal, and the initial deflection amount d was negative. That is, it was clear that the initial deflection position of these deflection vibration type piezoelectric elements is downwardly convex.

Displacement Measurement

With respect to the deflection vibration type piezoelectric elements of Example 1 and Comparative Example 5, the displacement was measured at room temperature (25° C.) when a sign (Sin) wave having an amplitude of 20 V, an offset voltage of 10 V, and a frequency of 1 kHz was applied thereto using "NLV-2500" manufactured by Polytec Ltd. As a result, the displacement amount in Comparative Example 5, which is PZT having a Morphotropic Phase Boundary (MPB) composition oriented in the (100) plane used for a general piezoelectric element, was 139 nm. In contrast, the displacement amount in Example 1 measured with the same structure was 154 nm. When comparing the displacement amounts of Example 1 and Comparative Example 5, it was confirmed that the displacement amount was improved by 10% in Example 1.

Initial Deflection and Deformation Efficiency

Figure 19:
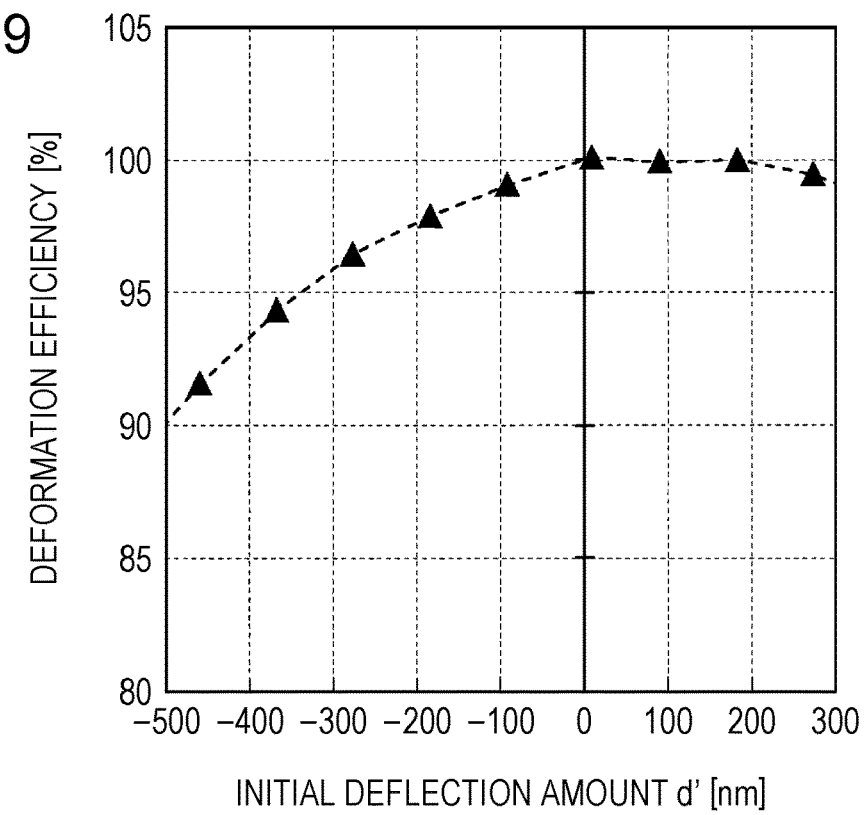
FIG. 19 is a graph showing deformation efficiency in a positive piezoelectric effect of Example 1.
Figure 20:
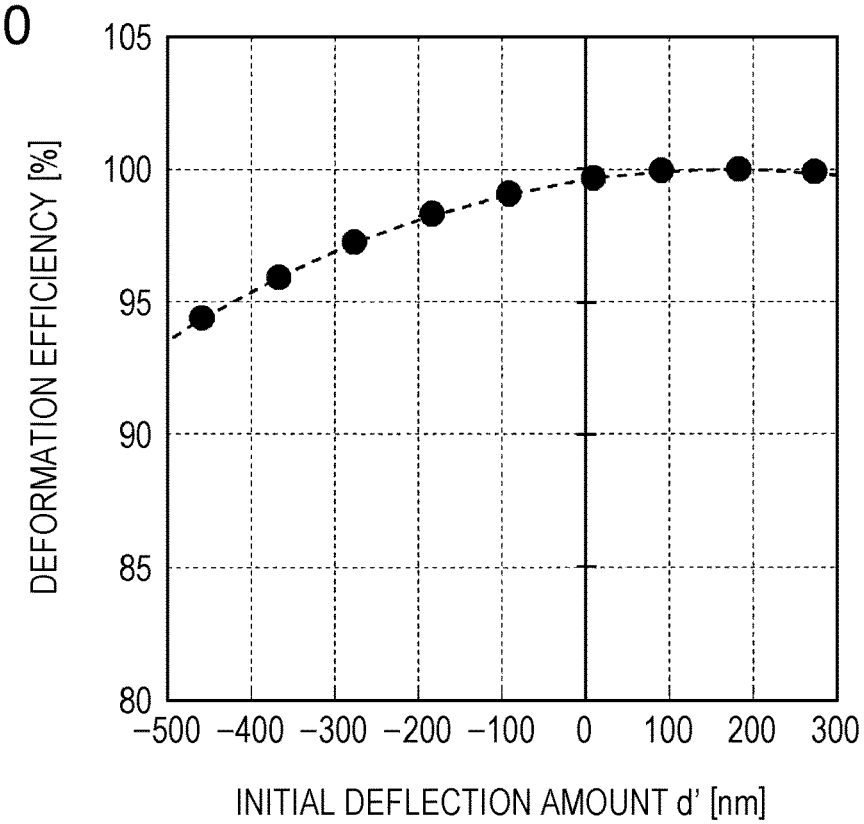
FIG. 20 is a graph showing deformation efficiency in an inverse piezoelectric effect of Example 1.

With respect to the deflection vibration type piezoelectric element of Example 1, an initial deflection amount d' [nm] was calculated using a finite element method (refer to JP-A-2013-163361), and the deformation efficiency [%] in the positive piezoelectric effect and the deformation efficiency [%] in the inverse piezoelectric effect were respectively compared with respect to this initial deflection amount d'. FIG. 19 is a diagram showing the deformation efficiency in the positive piezoelectric effect of Example 1, and FIG. 20 is a diagram showing the deformation efficiency in the inverse piezoelectric effect of Example 1. The results shown in FIG. 19 correlate with the sensor characteristics of the deflection vibration type piezoelectric element of Example 1, and the results shown in FIG. 20 correlate with the actuator characteristics of the deflection vibration type piezoelectric element.

As shown in FIG. 19, in the positive piezoelectric effect, in a case where the initial deflection amount d' of the deflection vibration type piezoelectric element is positive (an upwardly convex structure), the deformation efficiency is substantially constant, particularly, from level (0 nm) to +200 nm. On the other hand, in a case where the initial deflection amount d' is negative (downwardly convex structure), in particular, a decrease in deformation efficiency of 3% at −200 nm and 7% at −400 nm was confirmed. That is, in the case of being negative (a downwardly convex structure), the sensitivity decreased.

As shown in FIG. 20, the inverse piezoelectric effect was substantially constant in a case where the initial deflection amount d' of the deflection vibration type piezoelectric element was positive (upwardly convex structure). In contrast, in the case where the initial deflection amount d' is negative (a downwardly convex structure), in particular, a reduction in the deformation efficiency of 1% when level, 2% at −200 nm, and 5% at −400 nm was confirmed.

However, the results shown in FIG. 19 and FIG. 20 are the results of the shape of the deflection vibration type piezoelectric element of Example 1, and the magnitude of the values depends on the shape and size of the piezoelectric layer and CAV. As a result of investigations with various shapes different from those of Example 1, it was found that, when the initial deflection position of the deflection vibration type piezoelectric element is an upwardly convex structure, both the positive piezoelectric effect and the inverse piezoelectric effect have good efficiency.

Accordingly, in the deflection displacement-type piezoelectric elements (Examples 1 to 4) in which a perovskite-type composite oxide (piezoelectric material) having a crystal plane orientation of (100) and a tetragonal crystal structure is used for the piezoelectric layer, and each film and each layer in the vibrating section has a relationship of $T_1 \geq T_2$, it is possible for the initial deflection position to be an upwardly convex structure. Therefore, compared to the deflection displacement-type piezoelectric elements (Comparative Example 1 to Comparative Example 5) using a perovskite-type composite oxide in which the crystal plane orientation is other than (100) and the crystal structure is other than a tetragonal crystal, it is possible to improve the sensor characteristics and actuator characteristics.

Other Embodiments

In the embodiment described above, a liquid ejecting head mounted in a liquid ejecting apparatus is described as an example of a piezoelectric element application device to which the piezoelectric element of the invention is applied; however, the scope of application of the invention is not limited thereto. In addition, an ink jet recording head was described as an example of a liquid ejecting head; however, it is naturally possible to apply the invention to a liquid ejecting head which ejects liquids other than ink. Examples of a liquid ejecting head for ejecting liquid other than ink include a color material ejecting head used for manufacturing a color filter of a liquid crystal display or the like, an organic EL display, an electrode material ejecting head used for electrode formation such as an FED (field emission display), a bioorganic material ejecting head used for manufacturing biochips, and the like.

The piezoelectric element application device to which the piezoelectric element of the invention is applied has high piezoelectric characteristics and is therefore suitable as a piezoelectric actuator. Specific piezoelectric actuators include an ultrasonic motor, a vibration type dust removing apparatus, a piezoelectric transformer, a piezoelectric speaker, a piezoelectric pump, a temperature-electric converter, a pressure-electric converter, and the like.

In the embodiment described above, the deflection deformation type ultrasonic element (deflection displacement-type piezoelectric element) was described as an example of the piezoelectric element of the invention, but the scope of application of the invention is not limited thereto. Since the piezoelectric element of the invention has high piezoelectric performance, it is possible to suitably use the piezoelectric element of the invention for a piezoelectric sensor element. Specific examples of the sensor element include an ultrasonic detector (ultrasonic sensor), an angular velocity sensor, an acceleration sensor (gyro sensor), a vibration sensor, an inclination sensor, a pressure sensor, a collision sensor, a human sensor, an infrared sensor, a terahertz sensor, a heat detection sensor (thermal sensor), a pyroelectric sensor, a piezoelectric sensor, and the like. In addition, the piezoelectric element of the invention may be applied to a filter such as a blocking filter for harmful light such as infrared rays, an optical filter using a photonic crystal effect by quantum dot formation, an optical filter using optical interference of a thin film, or the like.

In an ultrasonic measuring apparatus on which an ultrasonic sensor is mounted, for example, it is also possible to form the ultrasound measurement apparatus by providing the piezoelectric element of the invention and a control means for measuring the detection object by using a signal based on at least one of ultrasonic waves transmitted by the piezoelectric element of the invention and ultrasonic waves received by the piezoelectric element of the invention. Such an ultrasonic measuring apparatus obtains information relating to the position, shape, speed, and the like of a measurement object based on the time from a time point at which ultrasonic waves are transmitted until a time point at which an echo signal in which the transmitted ultrasonic waves are reflected by the measurement object and returned is received, and a piezoelectric element may be used as an element for generating ultrasonic waves or an element for detecting echo signals. As such an ultrasonic wave generating element and an echo signal detecting element, it is possible to provide an ultrasonic measuring apparatus having excellent displacement characteristics.

Since the piezoelectric element application device to which the piezoelectric element of the invention is applied has high ferroelectricity, it is possible to suitably use the piezoelectric element of the invention for a ferroelectric element. Specific examples of the ferroelectric element include a ferroelectric memory (FeRAM), a ferroelectric transistor (FeFET), a ferroelectric operation circuit (FeLogic), a ferroelectric capacitor, and the like.

The piezoelectric element application device to which the piezoelectric element of the invention is applied is able to control the domain region using voltage, and thus is able to be suitably used in a voltage control type optical element. Specific examples of the optical element include a wavelength converter, an optical waveguide, an optical path modulator, a refractive index control element, an electronic shutter mechanism, and the like.

The piezoelectric element application device to which the piezoelectric element of the invention is applied exhibits favorable pyroelectric characteristics, thus the piezoelectric element application device is able to be suitably used for a pyroelectric element and application is also possible to a robot or the like using the various types of motor described above as a driving source.

Although not shown in the above embodiment, for example, a configuration is possible in which the side opposite to the piezoelectric element of the vibrating plate is a passage region for ultrasonic waves transmitted to the measurement object or ultrasonic waves (echo signals) reflected from the measurement object. According to this, it is possible to simplify the configuration of the vibrating plate on the side opposite to the piezoelectric element, and to ensure a good passage region for ultrasonic waves or the like. In addition, keeping the electrical regions such as the electrodes and the wiring and the adhesive fixing region of each member away from the measurement object makes it easy to prevent contamination and leakage current between the electrical regions and the adhesive fixing regions and the measurement object. Accordingly, it is also possible to suitably apply the invention to medical equipment which is particularly sensitive to contamination and leakage current, for example, an ultrasonic diagnostic apparatus (ultrasonic imaging apparatus), a sphygmomanometer, or a tonometer.

In addition, it is also preferable to bond a sealing plate for sealing the region including the piezoelectric element to the substrate. According to this, it is possible to physically protect the piezoelectric element, and the strength of the ultrasonic sensor also increases, thus, it is possible to enhance the structural stability. Furthermore, in a case where the piezoelectric element is formed as a thin film, it is also possible to improve the handling property of the ultrasonic sensor including the piezoelectric element.

In the embodiment described above, an example in which the opening is formed for each piezoelectric element is shown; however, the invention is not limited thereto, and openings may be formed corresponding to a plurality of piezoelectric elements. For example, an opening common to the rows of piezoelectric elements arranged in parallel in the scanning direction (X direction) may be provided, or one opening may be provided throughout. In a case where a common opening is provided for such a plurality of piezoelectric elements, the vibration states of the piezoelectric elements become different; however, the vibration may be carried out in the same manner as in a case where independent openings are provided, by providing pressing members or the like between each of the piezoelectric elements from the side opposite to the substrate of the vibrating plate.

In the embodiment described above, an example was given of a deflection deforming actuator formed of a CAV structure formed by ICP etching; however, the illustrated structure is not necessarily necessary as long as the piezoelectric element uses deflection deformation. Example structures include a structure in which a CAV structure is manufactured by wet etching, a structure in which a CAV pattern is formed with a photoresist, a structure in which a vibrating plate and a CAV pattern are formed separately and bonded, and a structure in which a vibrating plate is formed as a cantilever.

Figure 21:
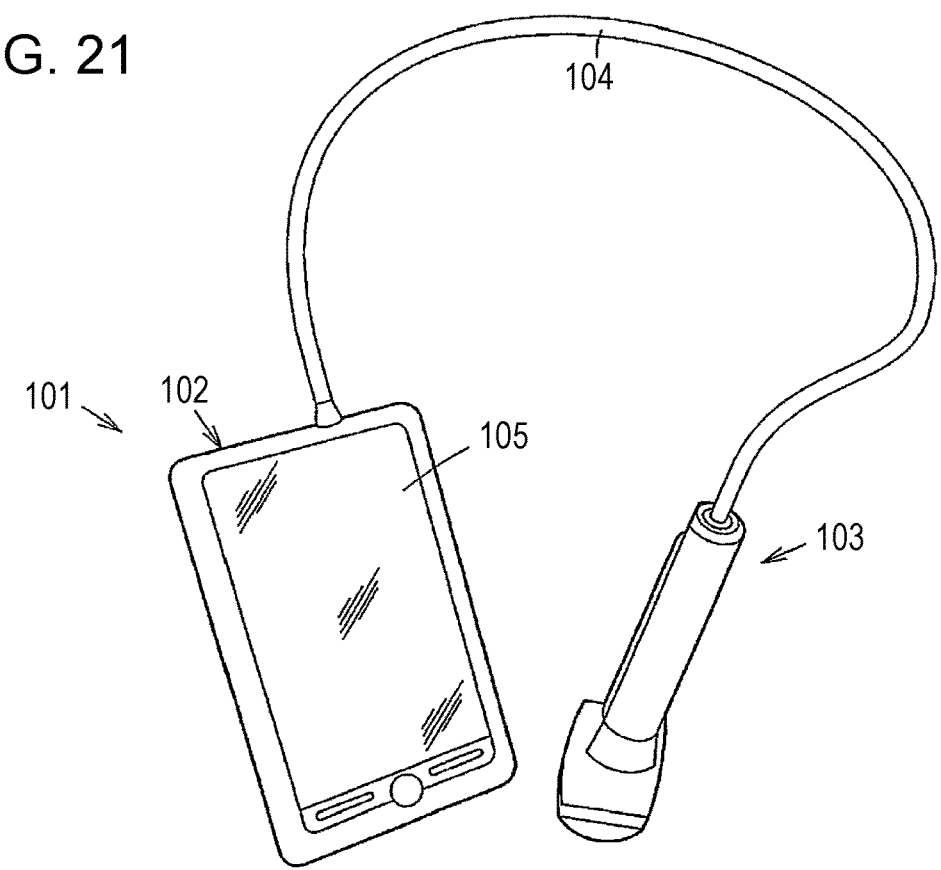
FIG. 21 is a perspective view showing an example of an ultrasonic imaging apparatus.
Figure 22:
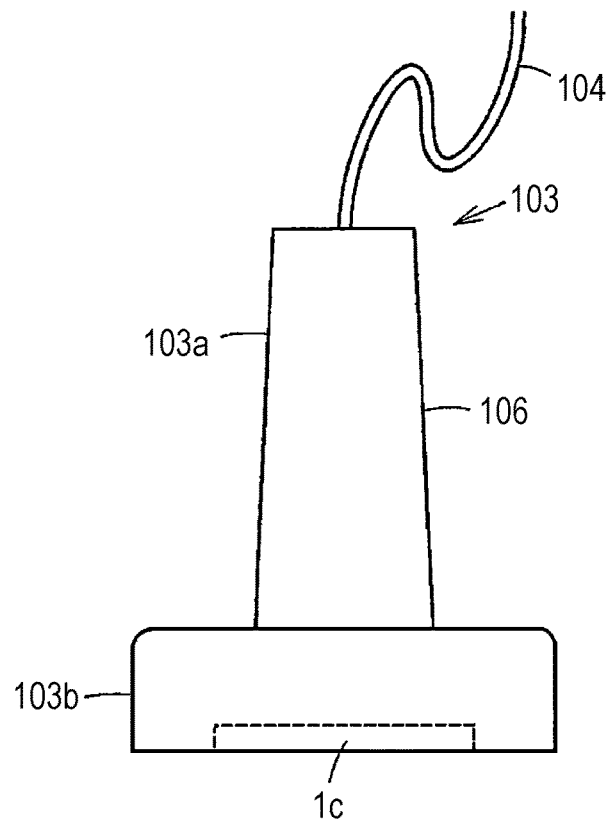
FIG. 22 is a front view showing an example of an ultrasonic probe.

Here, description will be given of an example of an electronic device using the ultrasonic sensor described above. In the present embodiment, descriptions will be given of an ultrasonic imaging apparatus as an example of an electronic apparatus and of an ultrasonic probe as an example of an ultrasonic device. FIG. 21 is a perspective view showing a schematic configuration of an example of an ultrasonic imaging apparatus. FIG. 22 is a plan view showing the ultrasonic probe.

As shown in FIG. 21, an ultrasonic imaging apparatus 101 is provided with an apparatus terminal 102 and an ultrasonic probe (probe) 103. The apparatus terminal 102 and the probe 103 are connected by a cable 104. The apparatus terminal 102 and the probe 103 exchange electrical signals through the cable 104. A display device (display panel) 105 is incorporated in the apparatus terminal 102. The screen of the display panel 105 is exposed on the surface of the apparatus terminal 102. In the apparatus terminal 102, an image is generated based on detected ultrasonic waves transmitted from the ultrasonic sensor 1c (refer to FIG. 22) of the probe 103. The detection results are displayed as an image on the screen of the display panel 105.

As shown in FIG. 22, the probe 103 has a housing 106. The housing 106 houses the ultrasonic sensor 1c in which a plurality of ultrasonic elements 10c (refer to FIG. 16 and the like) are two-dimensionally arranged in the X direction and the Y direction. The ultrasonic sensor 1c is provided such that the surface thereof is exposed on the surface of the housing 106. The ultrasonic sensor 1c outputs ultrasonic waves from the surface and receives reflected ultrasonic waves. In addition, it is possible to provide the probe 103 with a probe head 103b detachable from a probe main body 103a. At this time, it is possible to incorporate the ultrasonic sensor 1c in the housing 106 of the probe head 103b.

What is claimed is:

1. A piezoelectric element comprising:
   a vibrating section including a vibrating plate, a first electrode, a piezoelectric layer, a seed layer between the first electrode and the piezoelectric layer, and a second electrode,
   wherein a crystal orientation of a piezoelectric material forming the piezoelectric layer is (100) and a crystal structure of the piezoelectric material is a tetragonal crystal, and
   a total thickness $T_1$ of the vibrating plate, the first electrode, and the seed layer, and a total thickness $T_2$ of the piezoelectric layer and the second electrode have a relationship of $T_1 \geq T_2$.

2. The piezoelectric element according to claim 1, wherein 50% or more of the crystal structure of the piezoelectric material is tetragonal.

3. A method for manufacturing a piezoelectric element having a vibrating section including a vibrating plate, a first electrode, a piezoelectric layer, a seed layer between the first electrode and the piezoelectric layer, and a second electrode,
   wherein the piezoelectric layer is formed by a liquid phase method such that a crystal orientation of a piezoelectric material forming the piezoelectric layer is (100) and a crystal structure of the piezoelectric material is a tetragonal crystal, and
   the vibrating section is formed such that a total thickness $T_1$ of the vibrating plate, the first electrode, and the seed layer and a total thickness T2 of the piezoelectric layer and the second electrode have a relationship of $T_1 \geq T_2$.

4. The piezoelectric element according to claim 1, wherein a maximum thickness of the piezoelectric layer is 1.5 times a thickness of the vibrating plate.

5. The method for manufacturing according to claim 3, wherein a maximum thickness of the piezoelectric layer is 1.5 times a thickness of the vibrating plate.

* * * * *